(12) United States Patent
Watanabe

(10) Patent No.: US 8,354,318 B2
(45) Date of Patent: Jan. 15, 2013

(54) SEMICONDUCTOR MEMORY DEVICE AND METHOD OF FABRICATION OF THE SAME

(75) Inventor: Toshiharu Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 12/983,633

(22) Filed: Jan. 3, 2011

(65) Prior Publication Data

US 2011/0097862 A1 Apr. 28, 2011

Related U.S. Application Data

(62) Division of application No. 12/038,383, filed on Feb. 27, 2008, now Pat. No. 7,884,414.

(30) Foreign Application Priority Data

Feb. 28, 2007 (JP) ................................. 2007-050118

(51) Int. Cl.
*H01L 21/336* (2006.01)
(52) U.S. Cl. ................. 438/264; 438/257; 257/E21.422
(58) Field of Classification Search .......... 257/314–316, 257/320, 368, 510, E21.682, E21.422, E21.209, 257/E21.103, E29.129, E29.3, E29.302, E29.308, 257/E27.081; 438/257, 264; 365/185.05
See application file for complete search history.

(56) References Cited

U.S. PATENT DOCUMENTS

| 5,459,091 | A | 10/1995 | Hwang |
| 5,498,560 | A | 3/1996 | Sharma et al. |
| 6,136,705 | A | 10/2000 | Blair |
| 6,767,792 | B1 | 7/2004 | Wen et al. |
| 2002/0125544 | A1 | 9/2002 | Koishikawa |
| 2005/0212034 | A1 | 9/2005 | Sasago et al. |
| 2007/0047304 | A1 | 3/2007 | Lee et al. |
| 2007/0184615 | A1 | 8/2007 | Brazzelli et al. |
| 2007/0262368 | A1 | 11/2007 | Chang et al. |
| 2008/0044972 | A1* | 2/2008 | Mokhlesi ...................... 438/257 |
| 2009/0008704 | A1 | 7/2008 | Okamura |

FOREIGN PATENT DOCUMENTS

| JP | 2000-114402 | 4/2000 |
| JP | 2001-284473 | 10/2001 |
| JP | 2005-277035 | 10/2005 |
| JP | 2007-73957 | 3/2007 |
| KR | 10-2007-0025015 | 3/2007 |
| TW | 421895 | 2/2001 |
| WO | WO 2008/021736 A2 | 2/2008 |

OTHER PUBLICATIONS

Office Action issued May 10, 2011 in Japan Application No. 2007-050118 (With English Translation).
Office Action issued Mar. 26, 2012 in Taiwanese Patent Application No. 097106877 (with English translation).

* cited by examiner

*Primary Examiner* — Benjamin Sandvik
*Assistant Examiner* — Whitney T Moore
(74) *Attorney, Agent, or Firm* — Oblon, Spivak, McClelland, Maier & Neustadt, L.L.P.

(57) ABSTRACT

A semiconductor memory device includes a first memory cell transistor. The first memory cell transistor includes a tunnel insulation film provided on a semiconductor substrate, a floating electrode provided on the tunnel insulation film, an inter-gate insulation film provided on the floating electrode, and a control electrode provided on the inter-gate insulation film. The floating electrode includes a first floating electrode provided on the tunnel insulation film and a second floating electrode provided on one end portion of the first floating electrode, the floating electrode having an L-shaped cross section in a wiring direction of the control electrode.

7 Claims, 18 Drawing Sheets

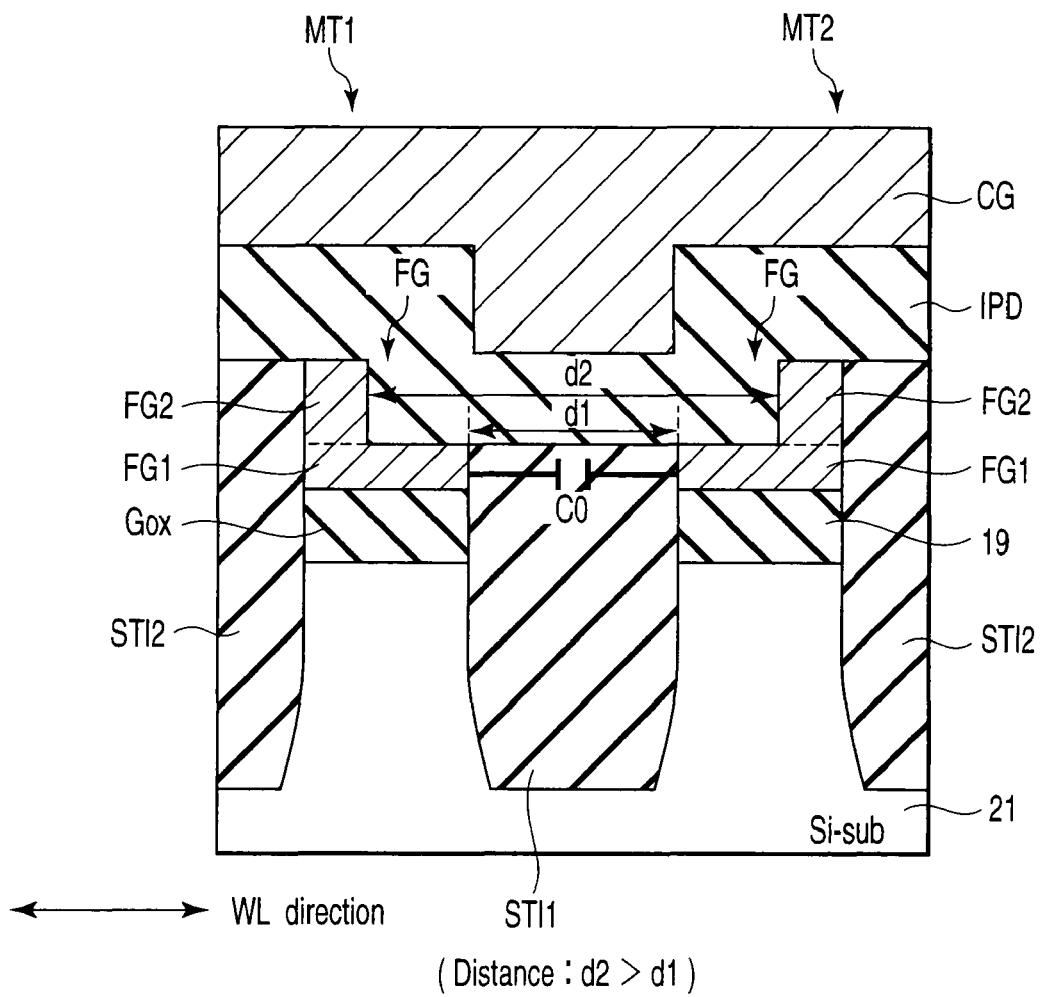
F I G. 1

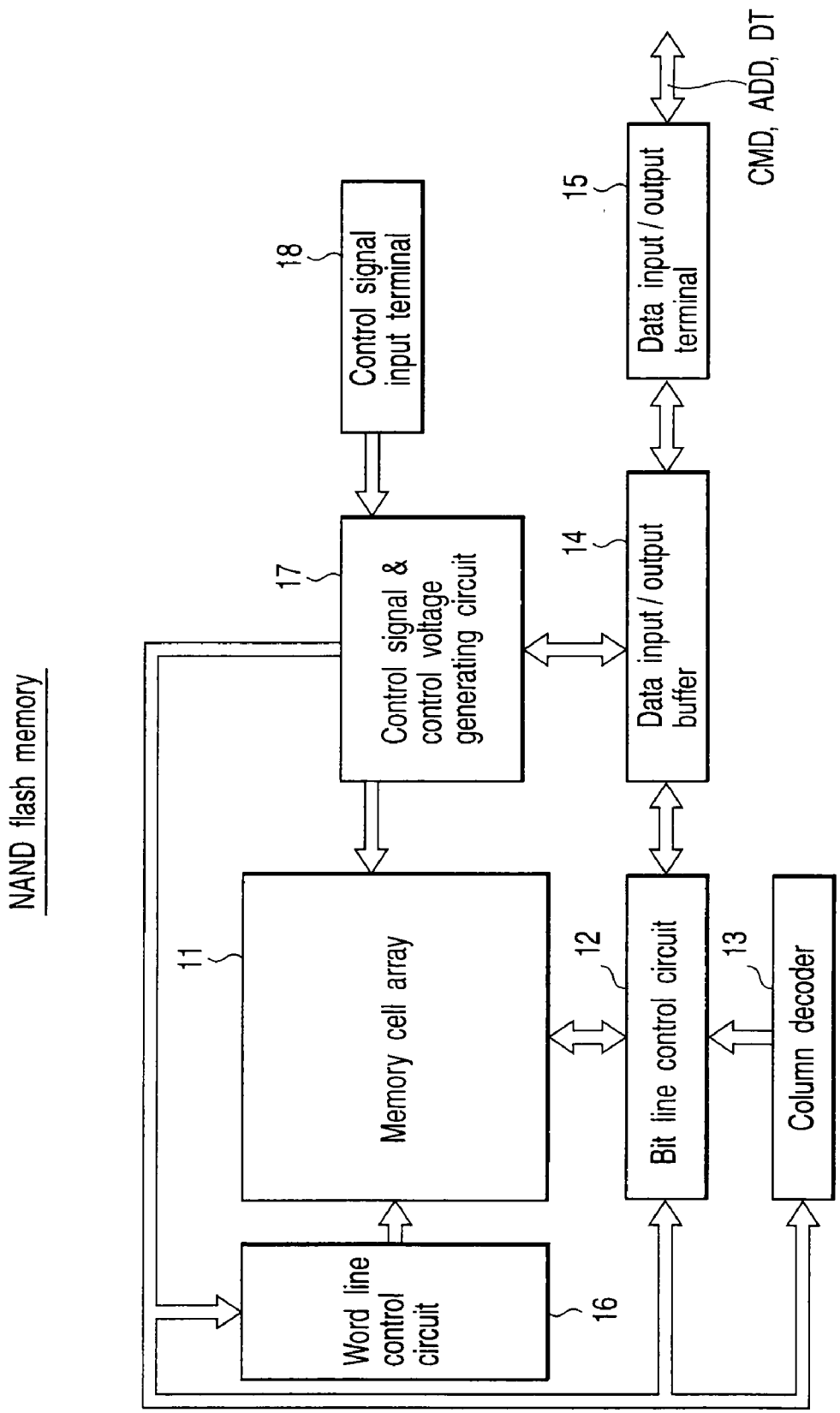
F I G. 2

(d2 > d1
HFG2 ≧ 2.0TIPD)

Other example of fabrication method (modification 1)

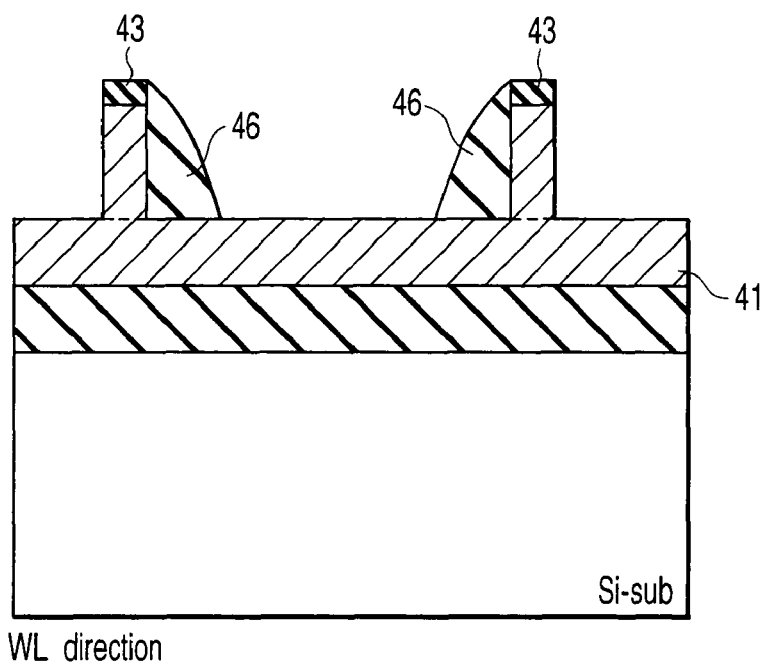
F I G. 1 6
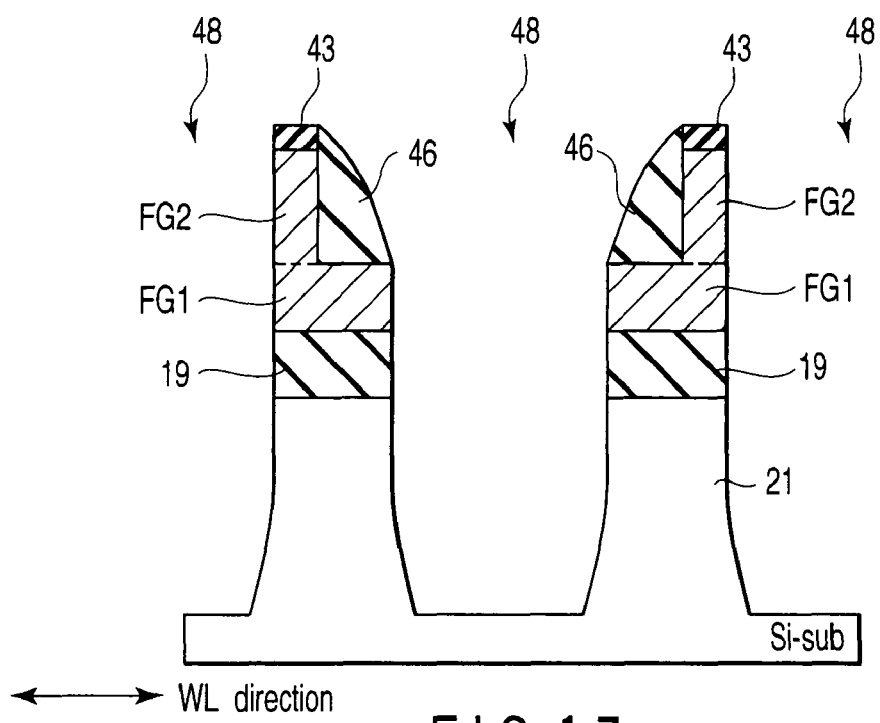
F I G. 1 7

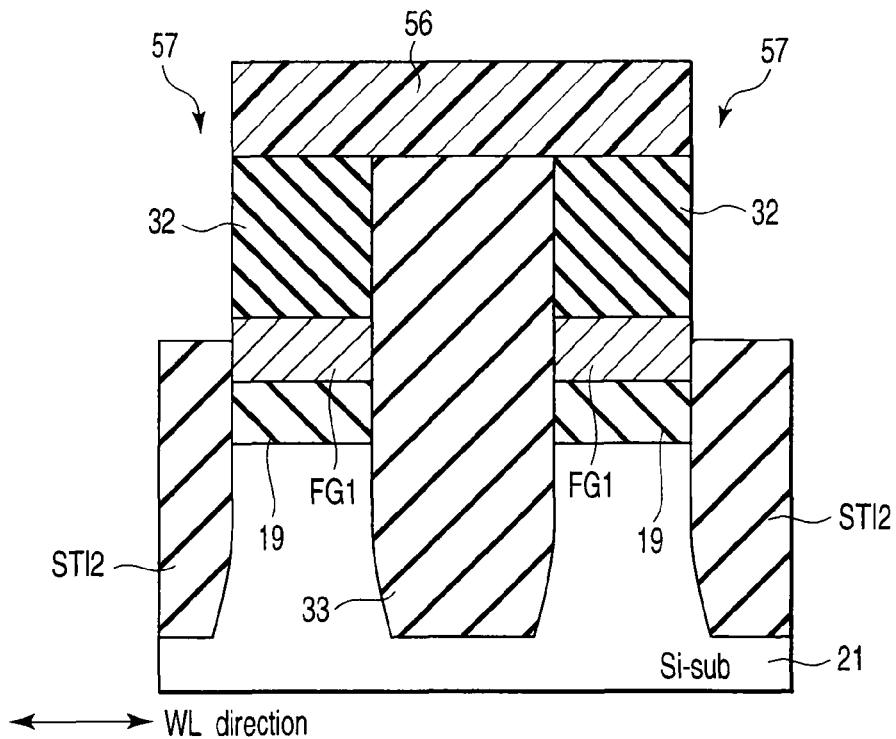
F I G. 19
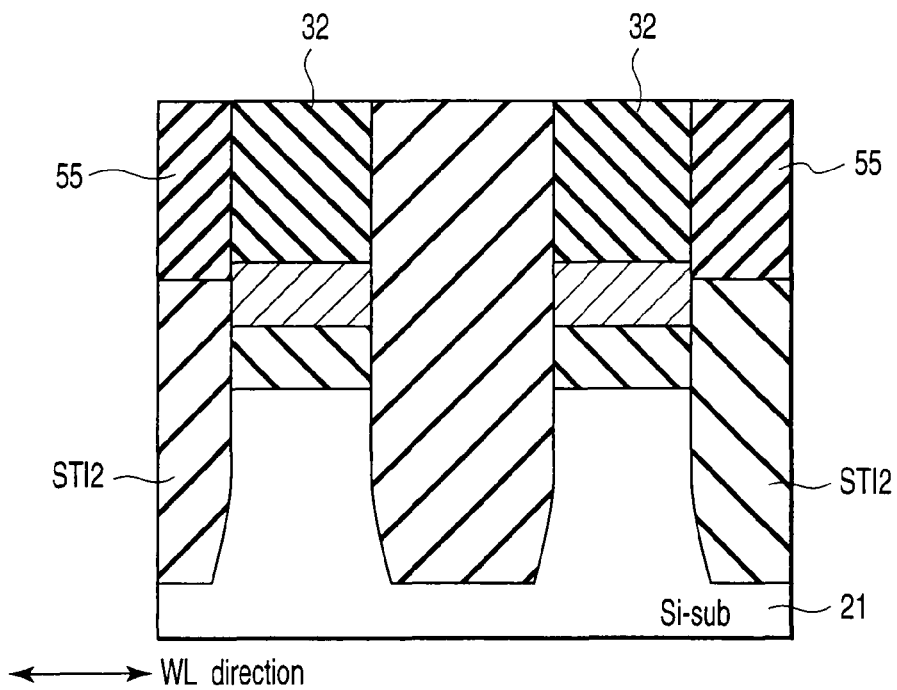
F I G. 20

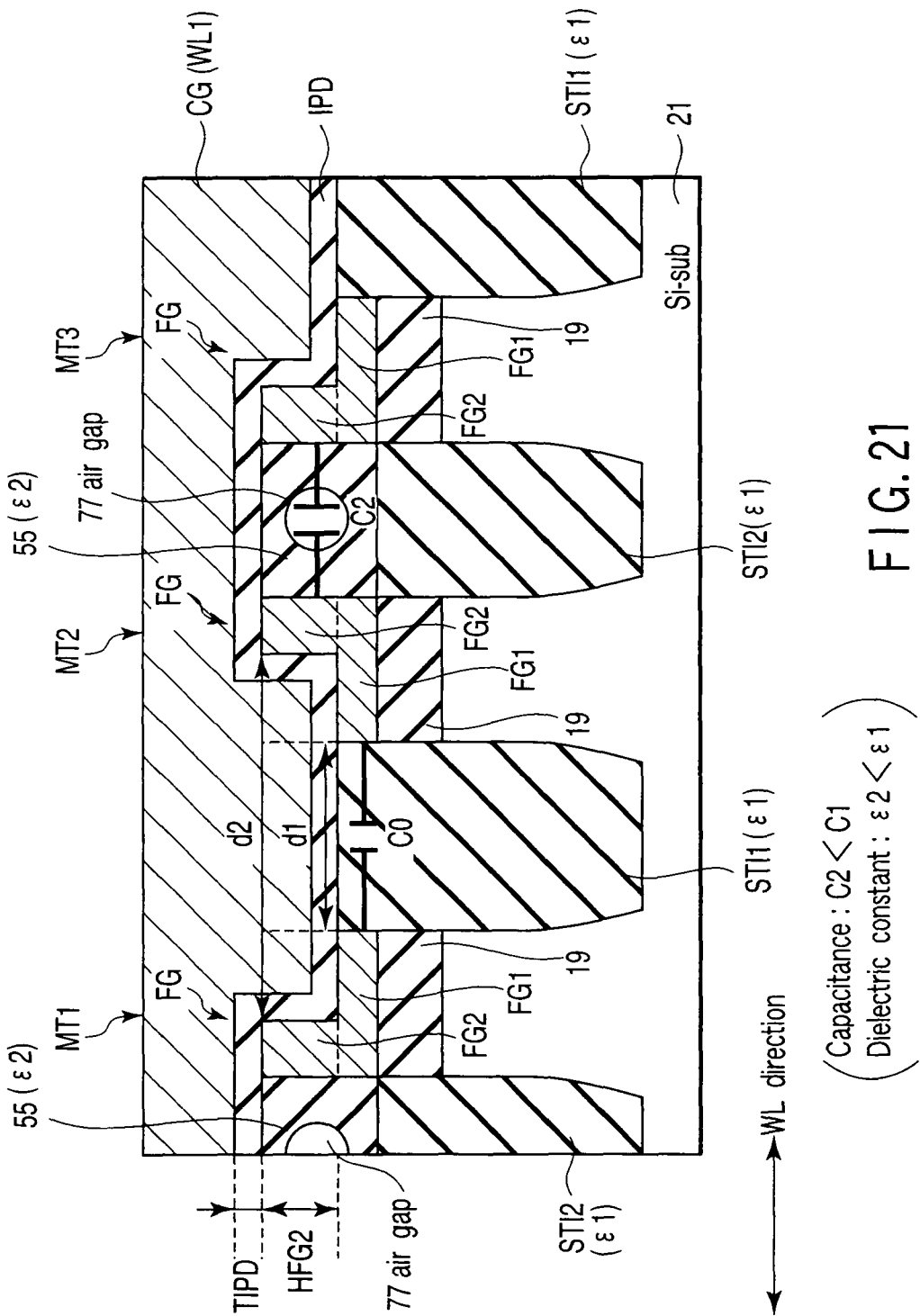
F I G. 21

(Capacitance value: C12 < C11)

SEMICONDUCTOR MEMORY DEVICE AND METHOD OF FABRICATION OF THE SAME

CROSS-REFERENCE TO RELATED APPLICATIONS

This application is a divisional of U.S. application Ser. No. 12/038,383 filed on Feb. 27, 2008, and is based upon and claims the benefit of priority from prior Japanese Patent Application No. 2007-050118, filed Feb. 28, 2007, the entire contents of each of which are incorporated herein by reference.

BACKGROUND OF THE INVENTION

1. Field of the Invention

The present invention relates to a semiconductor memory device and a method of fabricating the semiconductor memory device, and this invention is applied, for example, to a NAND flash memory.

2. Description of the Related Art

In recent years, semiconductor memory devices, for example, NAND flash memories, have begun to be used as main memories of various electronic devices, such as portable audio devices, by virtue of their merits of large capacity and nonvolatility.

Under the circumstances, in addition to the enhancement in functions, the increase in memory capacity is a challenge to the NAND flash memory. The simplest method for realizing the increase in memory capacity is to promote microfabrication of memory cells. However, if the microfabrication of memory cells is advanced, the parasitic capacitance between floating gates (FG), which neighbor in a word line direction (i.e. the direction of wiring of control gates (CG)), increases, and consequently the coupling noise between the floating gates (FG) increases.

There is such a relationship that the width between the floating electrodes (FG) of memory cell transistors, which neighbor in the word line direction, is the sum of double the thickness of an inter-gate insulation film (IPD) and the remaining space width. For example, in the case of a 63 nm-generation NAND flash memory, the remaining space width is about 15 nm or less. In other words, even in the 63 nm-generation NAND flash memory, the space width, which is left after the formation of the inter-gate insulation film (IPD), is only less than 15 nm. The control gate (GC) that is a conductor is formed in the space width, thereby shielding the parasitic capacitance and reducing the coupling noise between the neighboring floating gates (FG).

However, if the 63 nm generation, for example, transitions to the next generation of finer structures, the width between floating gates (FG) neighboring in the word line direction will be smaller.

Consequently, the width between floating gates (FG) neighboring in the word line direction becomes less than double the physical film thickness of the inter-gate insulation film (IPD) and the width between the neighboring floating gates (FG) is entirely filled with the inter-gate insulation film (IPD).

Specifically, the structure in which the control electrode (CG) is put in the above-described space width cannot be realized, and a conductor for shielding is not present between the neighboring floating gates (FG). Consequently, since the parasitic capacitance between the floating gates (FG) increases, the coupling noise between the floating gates (FG) increases.

The coupling noise is proportional to the magnitude of the parasitic capacitance between the neighboring floating gates (FG). If the coupling noise is large, the voltage variation, which is imparted by the voltage variation of one of the neighboring floating gates (FG) to the other floating gate (FG), would increase.

If the coupling noise is considered, the width between the neighboring floating gates (FG) cannot be decreased and the microfabrication is restricted.

A document relating to the present invention is Jpn. Pat. Appln. KOKAI Publication No. 2005-277035.

BRIEF SUMMARY OF THE INVENTION

According to an aspect of the present invention, there is provided a semiconductor memory device comprising: a first memory cell transistor, the first memory cell transistor comprising: a tunnel insulation film provided on a semiconductor substrate; an inter-gate insulation film provided above the tunnel insulation film; a control electrode provided on the inter-gate insulation film; and a floating electrode provided between the tunnel insulation film and the inter-gate insulation film, the floating electrode including a first floating electrode provided on the tunnel insulation film and a second floating electrode provided on one end portion of the first floating electrode, the floating electrode having an L-shaped cross section in a wiring direction of the control electrode.

According to another aspect of the present invention, there is provided a method of fabrication of a semiconductor memory device comprising: forming a tunnel insulation film on a semiconductor substrate; forming a first floating electrode material on the tunnel insulation film; forming trenches in that part of the semiconductor substrate which serves as device isolation regions, the trenches being formed through the first floating electrode material and the tunnel insulation film; forming device isolation insulation films are formed in the trenches such that the device isolation insulation films have an upper surface higher than that of the first control electrode material; forming a second floating electrode material on the insulation film, the first floating electrode material, and first and second device isolation insulation films; etching back the second floating electrode material and leaving the second floating electrode material on side walls of the insulation film, thereby forming a floating electrode having an L-shaped cross section; forming an inter-gate insulation film on the first and second device isolation insulation films and the first and second floating electrodes; and forming a control electrode on the inter-gate insulation film.

BRIEF DESCRIPTION OF THE SEVERAL VIEWS OF THE DRAWING

FIG. 1 is a cross-sectional view, taken in a word line direction, for describing the outline of the present invention;

FIG. 2 is a block diagram showing the entire structure of a semiconductor memory device according to a first embodiment of the present invention;

FIG. 16 is a cross-sectional view, taken in the word line direction, illustrating a fabrication step of the semiconductor memory device according to Modification 1 of the invention;

FIG. 17 is a cross-sectional view, taken in the word line direction, illustrating a fabrication step of the semiconductor memory device according to Modification 1 of the invention;

FIG. 19 is a cross-sectional view, taken in the word line direction, illustrating a fabrication step of the semiconductor memory device according to the second embodiment;

FIG. 20 is a cross-sectional view, taken in the word line direction, illustrating a fabrication step of the semiconductor memory device according to the second embodiment;

FIG. 21 is a cross-sectional view, taken in the word line direction, showing a semiconductor memory device according to a modification of the second embodiment;

DETAILED DESCRIPTION OF THE INVENTION

Outline

Figure 3:
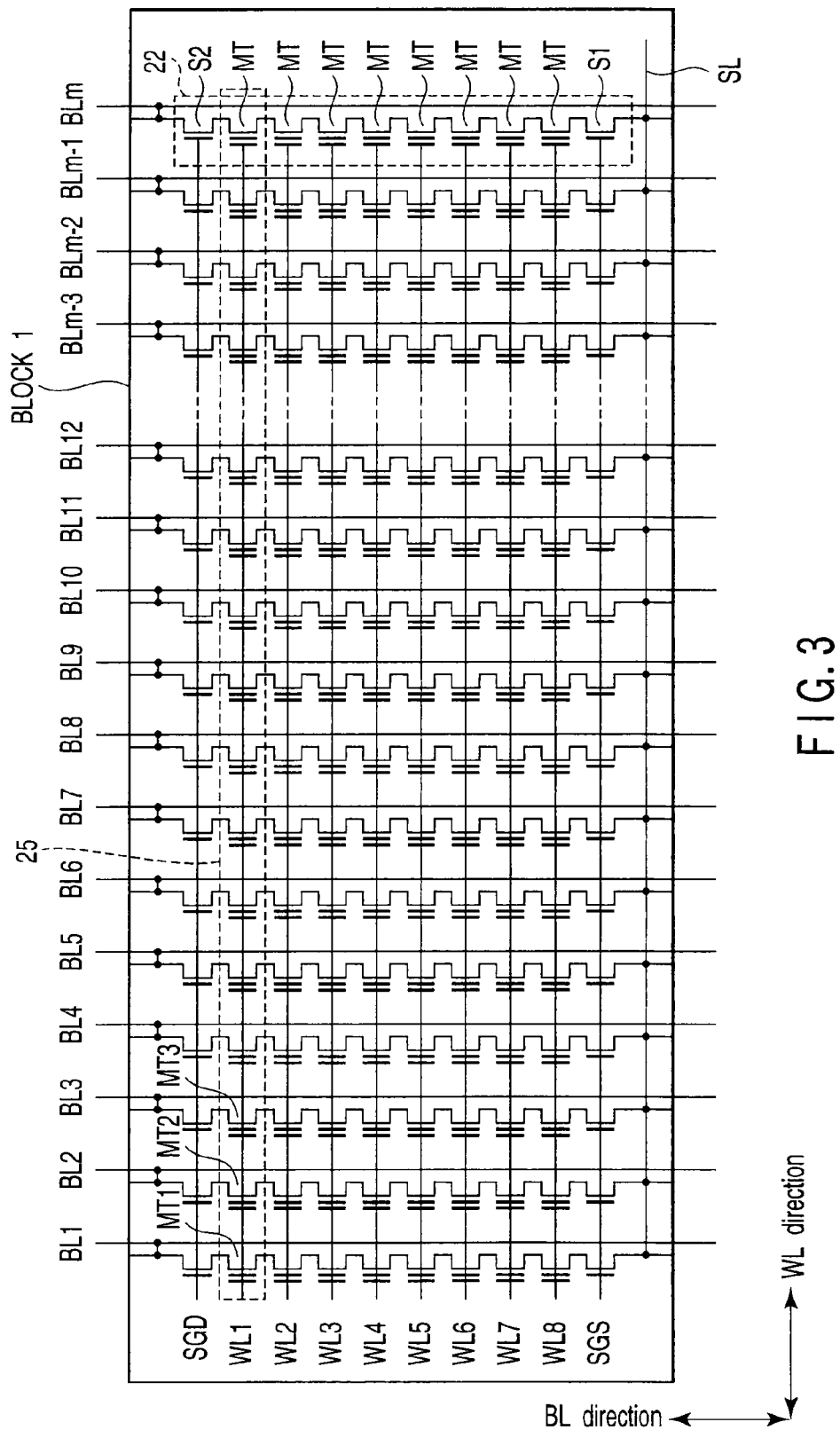
FIG. 3 is a circuit diagram showing one block (BLOCK) of the semiconductor memory device according to the first embodiment.

To begin with, the outline of the present invention is described with reference to FIG. 1.

In the present invention, for example, there is proposed a memory cell transistor having an L-shaped floating electrode, which includes at least a first floating electrode and a second floating electrode that is provided on one end portion of the first floating electrode, thereby to advantageously achieve microfabrication and to reduce coupling noise between floating electrodes that neighbor in the word line direction.

The structure of this memory cell transistor is, for example, that of each of first and second memory cell transistors MT1, MT2 shown in FIG. 1. FIG. 1 is a cross-sectional view taken in a word line (control electrode CG) direction.

As shown in FIG. 1, the first memory cell transistor MT1 includes a tunnel insulation film 19 provided on a silicon (Si) substrate 21; a floating electrode FG in which electronic charge is injected via the tunnel insulation film 19 or from which electronic charge is released via the tunnel insulation film 19; an inter-gate insulation film IPD provided on the floating electrode FG; and a control electrode CG provided on the inter-gate insulation film IPD. The floating electrode FG has an L shape, comprising a first floating electrode FG1 provided on the tunnel insulation film 19, and a second floating electrode FG2 provided on one end portion of the first floating electrode FG1. Specifically, the second floating electrode FG2 is provided on a partial area of the first floating electrode FG1 and is not provided on the other area of the first floating electrode FG1. The second memory cell transistor MT2 is disposed to neighbor the first memory cell transistor MT1 in the word line direction (WL direction), with a first device isolation insulation film STI1 being interposed. Similarly, the second memory cell transistor MT2 includes a tunnel insulation film 19 provided on the silicon (Si) substrate 21; a floating electrode FG in which electronic charge is injected through the tunnel insulation film 19; an inter-gate insulation film IPD provided on the floating electrode FG; and the control electrode CG provided on the inter-gate insulation film IPD. Further, the floating electrode FG of the second memory cell transistor MT2 has an L shape, comprising a first floating electrode FG1 provided on the tunnel insulation film 19, and a second floating electrode FG2 provided on one end portion of the first floating electrode FG1.

The distance d2 between the second floating electrodes FG2, which neighbor in the word line direction, of the first and second memory cell transistors MT1 and MT2 is greater than the distance d1 between the first floating electrodes FG1 which neighbor in the word line direction (distance: d2>d1).

Since the distance d2 is greater than the distance d1, as described above, even if the distance d1 between the first floating electrodes FG1 is less than about double the thickness of the inter-gate insulation film IPD, the space between the neighboring floating electrodes FG is not entirely filled with the inter-gate insulation film IPD. Therefore, the control electrode CG (word line WL) can be formed on the inter-gate insulation film IPD that is present between the second floating electrodes FG2.

Since a fixed voltage of, e.g. 0V can be applied to the control electrode CG, coupling noise between the neighboring floating electrodes FG can be shielded, and the parasitic capacitance C0 between the first floating electrodes FG1 can be reduced.

Thus, for example, even in the case where the degree of microfabrication is increased from the 63 nm generation and the width between the floating electrodes FG neighboring in the word line direction becomes smaller, it is possible to prevent the space between the floating gates FG from being entirely filled with the inter-gate insulation film IPD, and coupling noise can be reduced.

As has been described above, in the example of the present invention, there are proposed the first and second memory cell transistors MT1 and MT2, each having the L-shaped floating electrode FG including at least the first floating electrode FG1 and the second floating electrode FG2 provided on one end portion of the first floating electrode FG1.

According to the structure of the first and second memory cell transistors MT1 and MT2, microfabrication can advantageously be achieved, and the coupling noise between the floating electrodes neighboring in the word line direction can be reduced.

Next, a description is given of some embodiments of the invention, which are considered to be the best modes, and a modification of the invention. In the description below, common parts are denoted by common reference numerals throughout the drawings. In the embodiments and modification to be described below, NAND flash memories are exemplified.

First Embodiment

1. Entire Structure

To begin with, referring to FIG. 2, a description is given of the entire structure of a semiconductor memory device according to a first embodiment of the present invention. FIG. 2 is a block diagram showing a NAND flash memory according to this embodiment.

As shown in FIG. 2, the NAND flash memory comprises a memory cell array 11, a bit line control circuit 12, a column decoder 13, a data input/output buffer 14, a data input/output terminal 15, a word line control circuit 16, a control signal & control voltage generating circuit 17, and a control signal input terminal 18.

The memory cell array 11 is composed of a plurality of blocks. The word line control circuit 16 for controlling word lines and the bit line control circuit 12 for controlling bit liens are connected to the memory cell array 11.

The bit line control circuit 12 reads data of memory cell transistors in the memory cell array 11 via the bit lines, and detects the states of the memory cell transistors in the memory cell array 11 via the bit lines. In addition, the bit line control circuit 12 executes data write in the memory cells by applying write control voltages to the memory cell transistors in the memory cell array 11 via the bit lines. The column decoder 13 and the data input/output buffer 14 are connected to the bit line control circuit 12.

Data memory circuits (not shown) are provided in the bit line control circuit 12, and the data memory circuits are selected by the column decoder 13. The data of the memory cell transistors, which are read into the data memory circuits, are output to the outside from the data input/output terminal 15 via the data input/output buffer 14. The data input/output terminal 15 is connected to, for example, a host device which is disposed outside the NAND flash memory.

The host device is, for instance, a microcomputer, which receives data that is output from the data input/output terminal 15. Further, the host device outputs various commands CMD which control the operation of the NAND flash memory, addresses ADD and data DT. Write data, which is input to the data input/output terminal 15 from the host device, is delivered via the data input/output buffer 14 to the data memory circuits (not shown) which are selected by the column decoder 13. On the other hand, the commands and addresses are delivered to the control signal & control voltage generating circuit 17.

The word line control circuit 16 selects the word lines in the memory cell array 11, and applies voltages necessary for data read, write or erase to the selected word lines.

The control signal & control voltage generating circuit 17 is connected to the memory cell array 11, bit line control circuit 12, column decoder 13, data input/output buffer 14 and word line control circuit 16. These connected structural circuits are controlled by the control signal & control voltage generating circuit 17. The control signal & control voltage generating circuit 17 is connected to the control signal input terminal 18, and is controlled by control signals, such as an ALE (address latch enable) signal, which are input from the host device via the control signal input terminal 18.

The word line control circuit 16, bit line control circuit 12, column decoder 13 and control signal & control voltage generating circuit 17 constitute a write circuit and a read circuit.

2. Example of the Structure of the Block

Next, an example of the structure of blocks, which constitute the memory cell array 11, is described with reference to FIG. 3. In this description, one block BLOCK1 is exemplified. The memory cell transistors in the block BLOCK1 are erased batchwise. In other words, the block is an erase unit.

The block BLOCK1 is composed of a plurality of memory cell strings 22 which are arranged in the word line direction (WL direction). The memory cell string 22 comprises a NAND string, which is composed of eight memory cell transistors MT having series-connected current paths, a select transistor S1 which is connected to one end of the NAND string, and a select transistor S2 which is connected to the other end of the NAND string.

In this example, the NAND string is composed of eight memory cells MT. However, the NAND string may be composed of two or more memory cells, and the number of memory cells is not limited to eight.

The other end of the current path of the select transistor S2 is connected to a bit line BLm, and the other end of the current path of the select transistor S1 is connected to a source line SL.

Word lines WL1 to WL8 extend in the WL direction, and are commonly connected to a plurality of memory cell transistors which are arranged in the WL direction. A select gate line SGD extends in the WL direction, and is commonly connected to a plurality of select transistors S2 which are arranged in the WL direction. Similarly, a select gate line SGS extends in the WL direction, and is commonly connected to a plurality of select transistors S1 which are arranged in the WL direction.

A page 25 is present in each of the word lines WL1 to WL8. For example, as indicated by a broken-line box in FIG. 3, a page 25 is present in the word line WL1. Since a data read operation and a data write operation are executed in units of the page 25, the page 25 is a data read unit and a data write unit.

3. Example of Cross-Sectional Structure in the Word Line Direction

Next, an example of the cross-sectional structure in the word line direction is described with reference to FIG. 4. In this description, memory cell transistors MT1, MT2 and MT3, which are commonly connected to the word line WL1 in FIG. 3, are exemplified.

Figure 4:
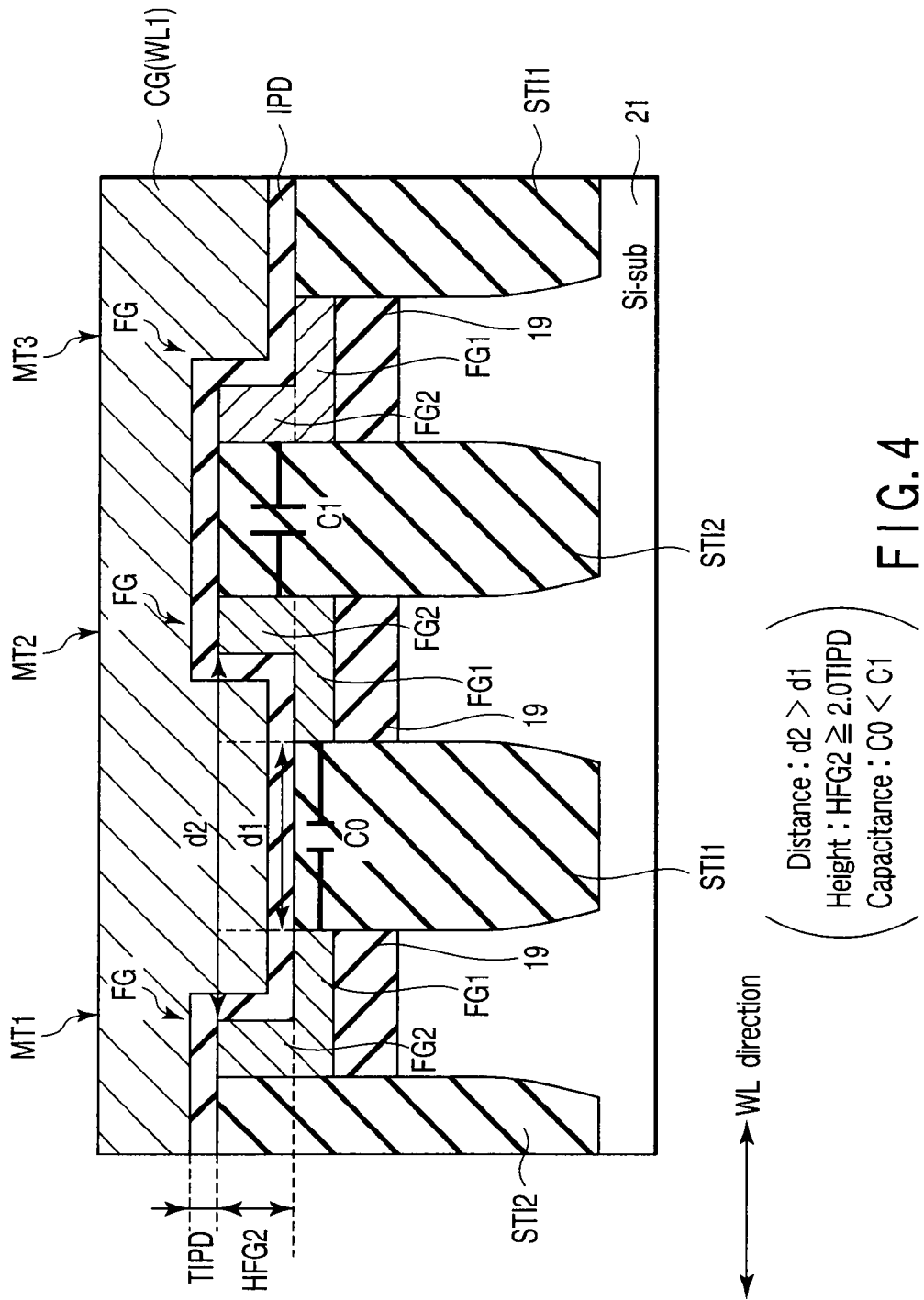
FIG. 4 is a cross-sectional view, taken in the word line direction, showing the semiconductor memory device according to the first embodiment.

As shown in FIG. 3, the second memory cell transistor MT2 is disposed to neighbor the first memory cell transistor MT1 in the word line direction (WL direction), with a first device isolation insulation film STI1 being interposed. The third memory cell transistor MT3 is disposed to neighbor the second memory cell transistor MT2 in the word line direction (WL direction), with a second device isolation insulation film STI2 being interposed.

Each of the first to third memory cell transistors MT1 to MT3 includes a tunnel insulation film 19 provided on a silicon (Si) substrate 21; a floating electrode FG in which electronic charge is injected via the tunnel insulation film 19 or from which electronic charge is released via the tunnel insulation film 19; an inter-gate insulation film IPD provided on the floating electrode FG; and a control electrode CG provided on the inter-gate insulation film IPD. The floating electrode FG of each of the first to third memory cell transistors MT1 to MT3 has an L shape, comprising a first floating electrode FG1 provided on the tunnel insulation film 19, and a second floating electrode FG2 provided on one end portion of the first floating electrode FG1. The shape of the second memory cell transistor MT2 has a reversed L shape in a mirror-symmetric relationship to the L shape of the first memory cell transistor MT1. The third memory cell transistor MT3 has the same L shape as the first memory cell transistor MT1, and has a mirror-symmetric relationship to the reversed L shape of the second memory cell transistor MT2.

The distance d2 between the second floating electrodes FG2, which neighbor in the word line direction, of the first and second memory cell transistors MT1 and MT2 is greater than the distance d1 between the first floating electrodes FG1 which neighbor in the word line direction (distance: d2>d1).

The inter-gate insulation film IPD is filled between the neighboring floating electrodes FG, and the height HFG2 of the second floating electrode should preferably be higher from the standpoint of the coupling ratio with the control electrode. To be more specific, the height HFG2 of the second floating electrode should more preferably be more than double the thickness TIPD of the inter-gate insulation film IPD (height HFG2≧2.0 TIPD).

In general, the magnitude of the capacitance C of the capacitor, which is formed between two conductors, is expressed by $$C = \in S/d \qquad (\text{\ensuremath{\times}})$$

where $\in$ is a dielectric constant of the substance between the two conductors, S is the area of the two conductors, and d is the distance between the two conductors.

Thus, in the case of the present invention, from the above equation (✗) the capacitance value of the parasitic capacitance C0, which occurs in the first device isolation insulation film STI1 in the first and second memory cell transistors MT1 and MT2, is less than the capacitance value of the parasitic capacitance C1 which occurs in the device isolation insulation film STI2 in the second and third memory cell transistors MT2 and MT3 (capacitance: C0<C1).

4. Example of Cross-Sectional Structure in the Bit Line Direction

Next, an example of the cross-sectional structure in the bit line direction is described with reference to FIG. 5. In the description below, the cross-sectional structure of the memory cell string 22 on the bit line BLm in FIG. 3 is exemplified.

Figure 5:
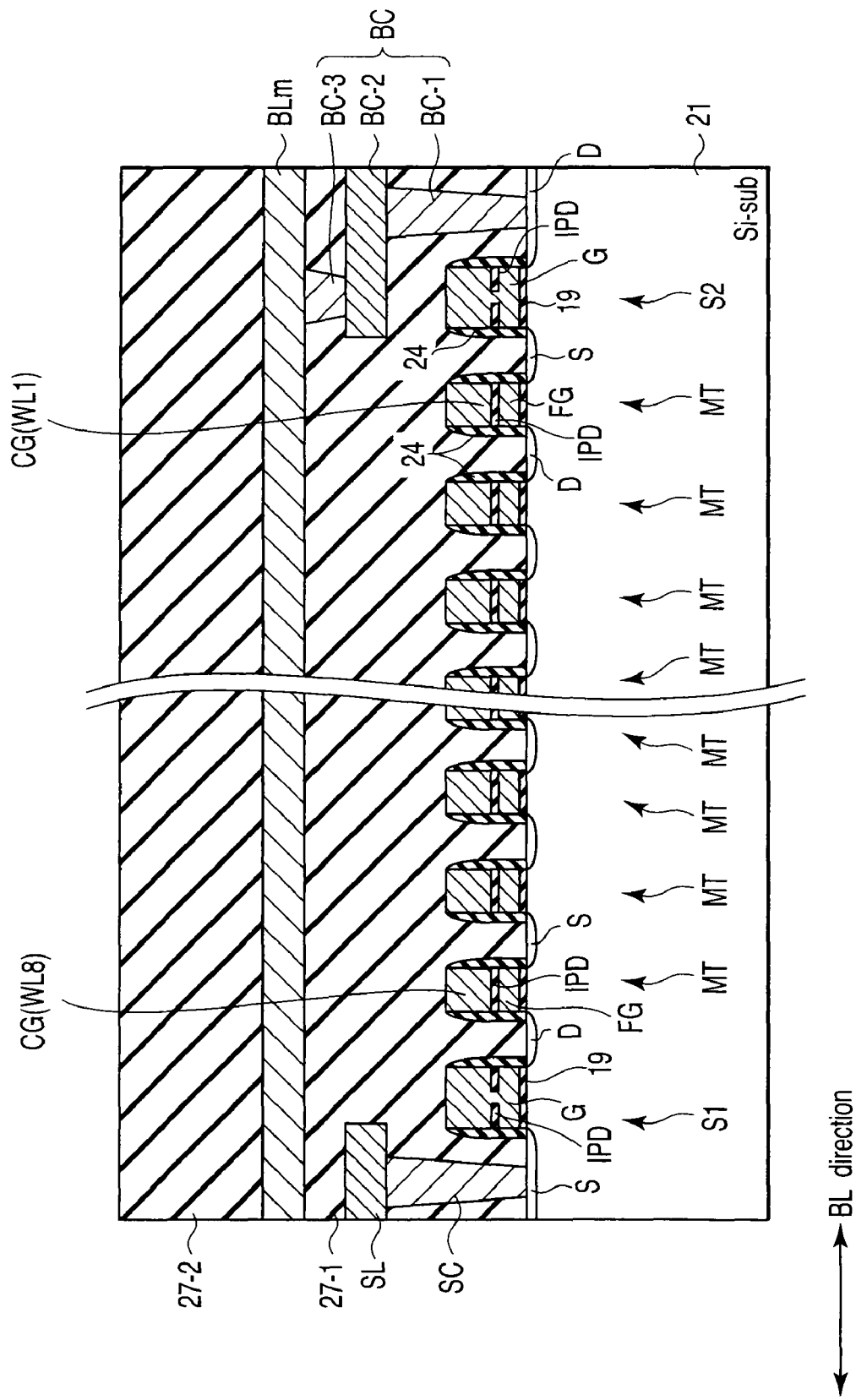
FIG. 5 is a cross-sectional view, taken in a bit line direction, showing the semiconductor memory device according to the first embodiment.

As shown in FIG. 3 and FIG. 5, the memory cell string 22 is composed of the select transistors S1 and S2 which select the memory cell string 22, and the memory cells MT.

The memory cell MT is the above-described multi-layer structure that is provided at the intersection between the bit line BL and the word line WL. The source S/drain D, which is the current path of the memory cell MT, is connected in series to the source S/drain D of the neighboring memory cell MT. One end of the current path is connected to the bit line BL via the select transistor S2, and the other end of the current path is connected to the source line SL via the select transistor S1.

Each of the memory cells MT has spacers 24 which are provided along side walls of the multi-layer structure, and a source S and a drain D which are provided in the semiconductor substrate (or in a P well (not shown)) so as to sandwich the multi-layer structure.

The select transistor S1, S2 includes a gate insulation film 19, an inter-gate insulation film IPD, and a gate electrode G. The inter-gate insulation film IPD of the select transistor S1, S2 is split at its central part, and the upper and lower layers of the inter-gate insulation film IPD are configured to be electrically connected. The gate electrode G is formed of, for instance, a polysilicon layer and a silicide layer which is provided on the polysilicon layer.

The select transistor S1, S2 similarly includes spacers 24 which are provided along side walls of the gate electrode G, and a source S and a drain D which are provided in the semiconductor substrate (or in the P well (not shown)) so as to sandwich the gate electrode G.

The bit line BLm is electrically connected to the drain D of the select transistor S2 via bit line contacts BC-1, BC2 and BC-3 in an interlayer insulation film 27-1.

The source line is electrically connected to the source S of the select transistor S1 via source line contacts SC-1 and SC-2 in the interlayer insulation film 27-1.

5. Example of the Fabrication Method

An example of the method of fabrication is described with reference to FIG. 6 to FIG. 11. In the description below, the memory cell transistors MT1 and MT2, which have been described with reference to FIG. 4, are exemplified.

To start with, although not shown, N-type impurities are doped in a P-type silicon substrate (Si-sub) 21, for example, by an ion implantation method, and an N-type well (n-well) is formed. Then, P-type impurities, such as boron, are doped in the formed N-type well with a concentration of about $10^{14}$ cm$^{-3}$ to $10^{19}$ cm$^{-3}$ by, e.g. ion implantation, and a P-type well (p-well) is formed.

Figure 6:
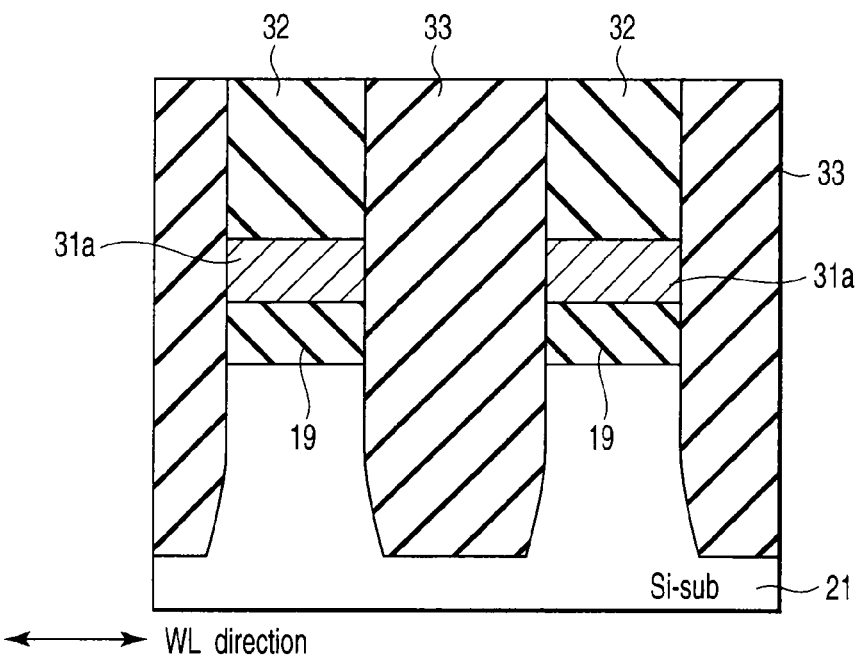
FIG. 6 is a cross-sectional view, taken in the word line direction, illustrating a fabrication step of the semiconductor memory device according to the first embodiment.

Subsequently, as shown in FIG. 6, an oxide film is formed on the semiconductor substrate (P-type well) 21 by, e.g. a thermal oxidation method, and thus a tunnel insulation film 19 is formed. Then, a polysilicon layer, for instance, is formed on the tunnel insulation film 19 by, e.g. CVD (Chemical Vapor Deposition), and a first floating gate material 31a is formed. A silicon nitride layer, for instance, is formed on the first floating electrode material 31a by, e.g. CVD, and thus a cap material 32 is formed.

The cap material 32, which becomes a device isolation region, is selectively etched away. Using the remaining cap material 32 as a mask, anisotropic etching, such as RIE (Reactive Ion Etching), is performed, and a trench, which penetrates the first floating gate material 31a and tunnel insulation film 19, is formed in the semiconductor substrate 21.

Then, a buried insulation film 33 is filled in the trench by, e.g. CVD. The buried insulation film 33 is planarized at a level of the surface of the cap material 32 by, e.g. CMP (Chemical Mechanical Polishing).

Figure 7:
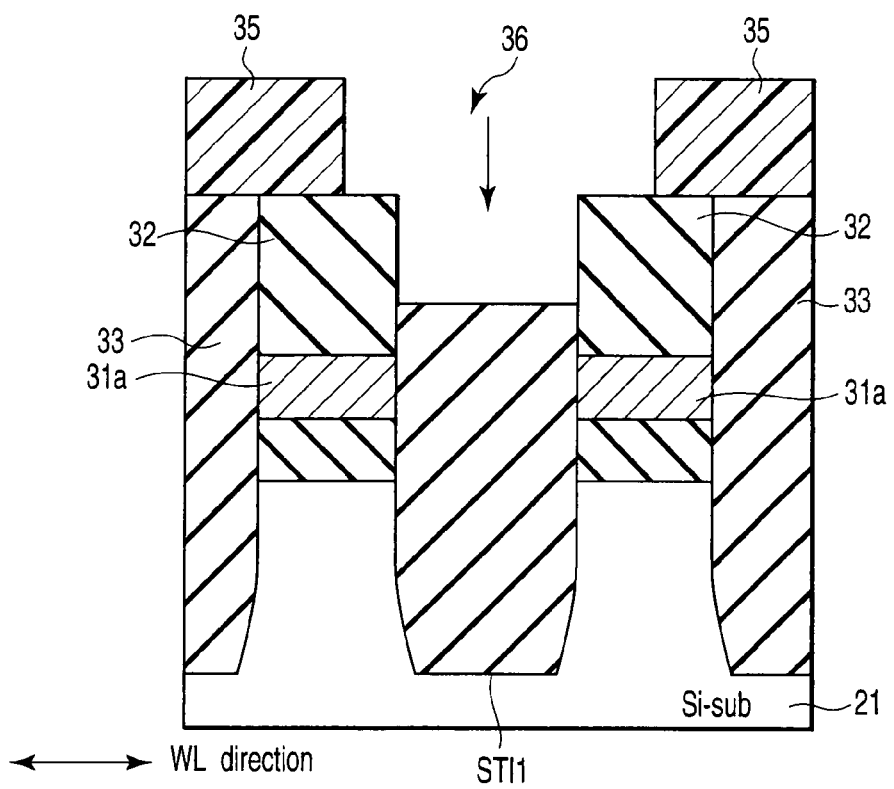
FIG. 7 is a cross-sectional view, taken in the word line direction, illustrating a fabrication step of the semiconductor memory device according to the first embodiment.

Thereafter, as shown in FIG. 7, a photoresist 35 is coated on the cap material 32 and buried insulation film 33. The photoresist 35 is exposed and developed, thereby forming an opening 36 which exposes the surface of the buried insulation film 33 that becomes a first device isolation insulation film interposed between the first and second memory cell transistors. Then, using the photoresist 35 and mask material 32 as a mask, the buried insulation film 33 at the exposed part is selectively wet-etched by a chemical such as ammonium fluoride or hydrofluoric acid, thereby decreasing the height of the buried insulation film 33. Thus, the first device isolation insulation film STI1 is formed. In the case of the present example, the upper surface of the first device isolation insulation film STI1 is formed to be higher than the upper surface of the first floating gate electrode material 31a.

Figure 8:
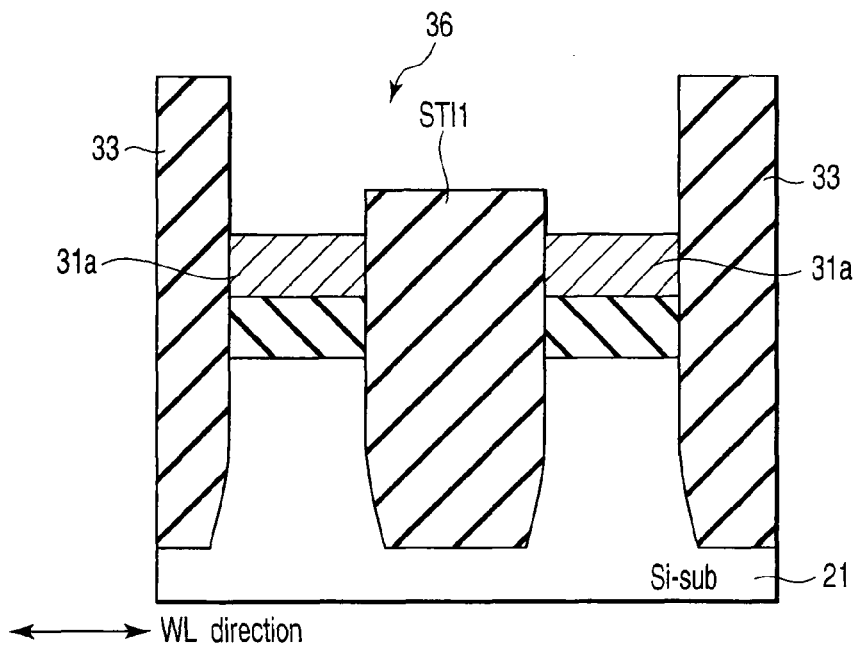
FIG. 8 is a cross-sectional view, taken in the word line direction, illustrating a fabrication step of the semiconductor memory device according to the first embodiment.

Then, as shown in FIG. 8, the photoresist 35 is peeled by, e.g. an asher. Subsequently, the cap material 32 is removed by wet etching using, e.g. not phosphoric acid.

Figure 9:
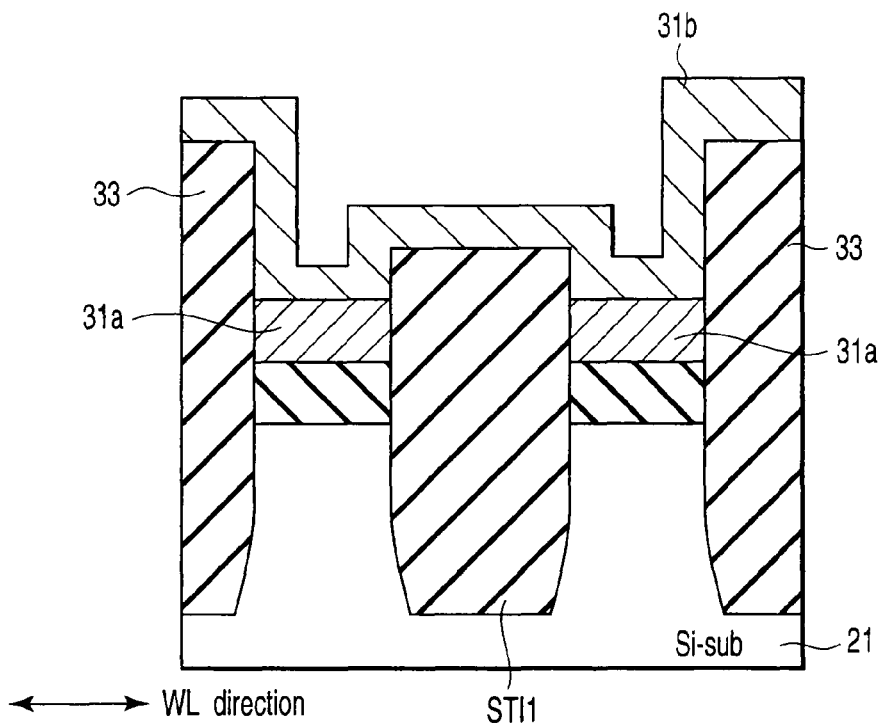
FIG. 9 is a cross-sectional view, taken in the word line direction, illustrating a fabrication step of the semiconductor memory device according to the first embodiment.

Then, as shown in FIG. 9, a polysilicon layer, for instance, is deposited by, e.g. CVD on the buried insulation film 33, the first floating electrode material 31a and the first device isolation insulation film STI1, and thereby a second floating electrode 31b is formed.

Figure 10:
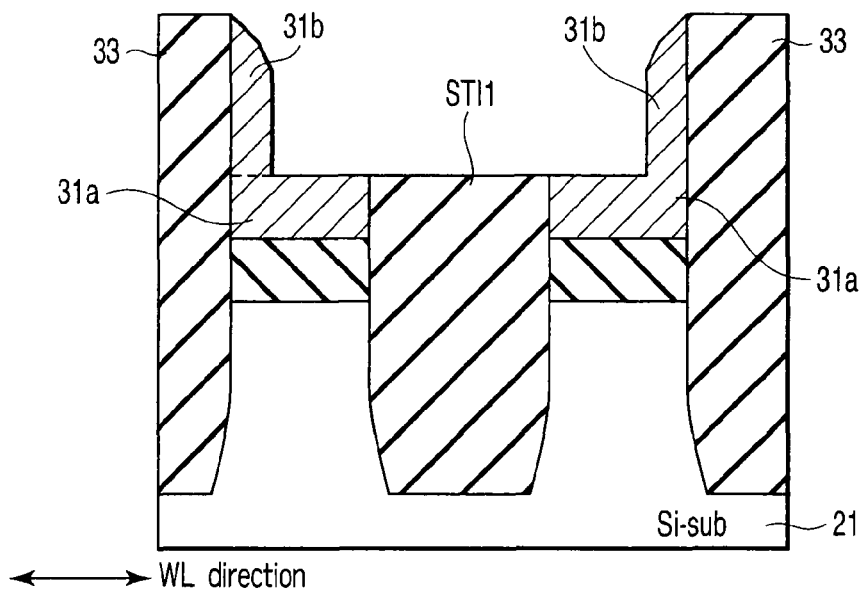
FIG. 10 is a cross-sectional view, taken in the word line direction, illustrating a fabrication step of the semiconductor memory device according to the first embodiment.

Subsequently, as shown in FIG. 10, the second floating electrode material 31b is etched back by anisotropic etching such as RIE, and the second floating electrode material 31b is left on the side wall of the buried insulation film 33.

Figure 11:
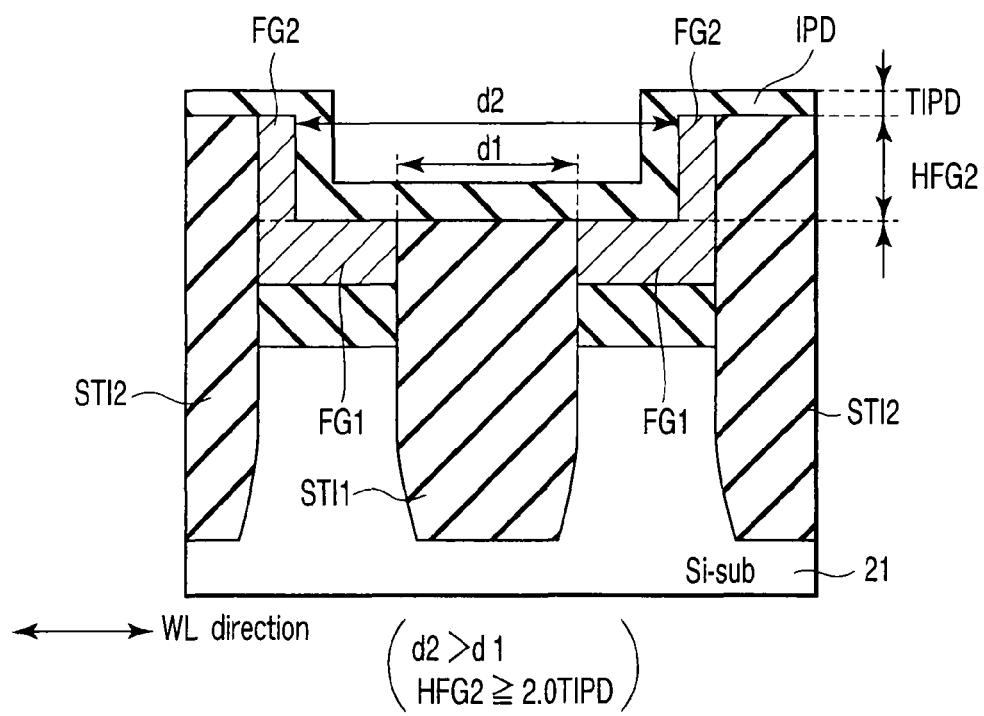
FIG. 11 is a cross-sectional view, taken in the word line direction, illustrating a fabrication step of the semiconductor memory device according to the first embodiment.

Then, as shown in FIG. 11, for example, using CMP, the surface of the second floating electrode material 31b and the surface of the buried insulation film 33 are planarized, and the second floating electrode FG2 and the second device isolation insulation film STI2 are formed. At this time, it is more desirable to set the height HFG2 of the second floating electrode material 31b, which becomes the second floating electrode FG2, at more than double the thickness TIPD of an inter-gate insulation film IPD that is to be formed subsequently.

Subsequently, for example, using CVD, an ONO insulation film (a three-layer film comprising a silicon oxide film, a silicon nitride film and a silicon oxide film) is formed over the first and second device isolation insulation films STI1 and STI2 and the first and second floating electrodes FG1 and FG2, and thus the inter-gate insulation film IPD is formed.

As has been described above, the distance d2 between the second floating electrodes FG2, which neighbor in the word line direction, is greater than the distance d1 between the first floating electrodes FG1 which neighbor in the word line direction (distance: d2>d1). Thus, when the inter-gate insulation film IPD is formed, it is possible to prevent the space between the neighboring floating electrodes, which neighbor in the word line direction, from being entirely filled with the inter-gate insulation film IPD, and a predetermined space can be formed between the floating electrodes.

Although not shown, for example, using CVD, a polysilicon layer is deposited on the inter-gate insulation film IPD, and thus a control gate which becomes a word line is formed. At this time, since the above-mentioned space is formed between the floating electrodes that neighbor in the word line direction, the control electrode can be formed in the space.

Subsequently, using well-known fabrication steps, an interlayer insulation film, a bit line contact, a source line contact, a bit line and a source line are formed, and the semiconductor memory device according to the present embodiment is fabricated.

6. Advantageous Effects of the Present Embodiment

According to the semiconductor memory device and the fabrication method relating to the present embodiment, at least the following advantageous effects (1) and (2) can be obtained.

(1) Microfabrication can advantageously be achieved, and the coupling noise between the floating electrodes neighboring in the word line direction can be reduced.

As described above, the first and second memory cell transistors MT1 and MT2 according to the present embodiment include the L-shaped floating electrode FG comprising the first floating electrode FG1 provided on the tunnel insulation film 19, and the second floating electrode FG2 provided on one end portion of the first floating electrode FG1.

The distance d2 between the second floating electrodes FG2, which neighbor in the word line direction, of the first and second memory cell transistors MT1 and MT2 is greater than the distance d1 between the first floating electrodes FG1 which neighbor in the word line direction (distance: d2>d1).

Since the distance d2 is greater than the distance d1, as described above, even if the distance d1 between the first floating electrodes FG1 is less than about double the thickness of the inter-gate insulation film IPD, the space between the neighboring floating electrodes FG is not entirely filled with the inter-gate insulation film IPD. Therefore, the control electrode CG (word line WL) can be formed on the inter-gate insulation film IPD that is present between the second floating electrodes FG2.

A fixed voltage of, e.g. 0V can be applied to the control electrode CG. Thus, since the parasitic capacitance C0 between the first floating electrodes FG1 can be reduced, the coupling noise between the floating electrodes FG can be shielded and the value of the coupling noise can be reduced.

Thus, for example, even in the case where the degree of microfabrication is increased from the 63 nm generation and the width between the floating electrodes FG neighboring in the word line direction becomes smaller, it is possible to prevent the space between the floating electrodes FG from being entirely filled with the inter-gate insulation film IPD.

For example, in the case where the width of the device isolation insulation film in the word line direction is about 20 nm and the thickness of the inter-gate insulation film IPD is about 13 nm, the space between the floating electrodes FG would be entirely filled with the inter-gate insulation film IPD in a semiconductor memory device with the structure in which the floating electrode FG of the present embodiment is not provided.

On the other hand, in the case where the L-shaped floating electrode according to the present embodiment is provided and the thickness of the second floating electrode FG2 in the word line direction is, e.g. about 10 nm, the distance d2 between the second floating electrodes FG2 can be set at about 40 nm. Thus, even if the thickness of the inter-gate insulation film IPD is about 13 nm, a predetermined space can be formed between the second floating electrodes FG2. As a result, the control electrode CG can be formed in this space on the inter-gate insulation film IPD, and there is no concern of depletion.

Since the width of the first device isolation insulation film STI1 will decrease more and more by the microfabrication in the future, it appears that the distance d1 between the floating electrodes FG2 becomes further smaller. On the other hand, as indicated by the above equation ($\times$) the capacitance value of the parasitic capacitance C0 is inversely proportional to the distance between the floating electrodes FG that neighbor in the word line direction and is proportional to the area thereof. In the case of the present embodiment, the mutually opposed area of the first floating electrodes FG1, which contributes to the parasitic capacitance C0, is further reduced, and thereby the parasitic capacitance C0 can be reduced even if the distance d1 between the first floating electrodes FG1 decreases with the advancement in microfabrication in the future, and the coupling noise can advantageously be reduced.

(2) The manufacturing cost can advantageously be reduced.

When the second floating electrodes FG2 are formed, as shown in FIG. 9 and FIG. 10, the second floating electrodes FG2 can be formed in a self-alignment manner by leaving the second floating electrode material 31b on the side walls of the buried insulation film 33. Thus, the manufacturing cost can advantageously be reduced in that there is no need to perform a special fabrication step, such as patterning, for forming the second floating electrodes FG2.

Modification 1

Another Example of Fabrication Method

Next, a method of fabrication of the semiconductor memory device according Modification 1 is described with reference to FIG. 12 to FIG. 17. Modification 1 relates to another example of the fabrication method of the semiconductor memory device which has been described in connection with the first embodiment. A detailed description of the parts common to those in the first embodiment is omitted. In the description below, the memory cell transistor MT1, MT2, which has been described with reference to FIG. 4, is exemplified.

Figure 12:
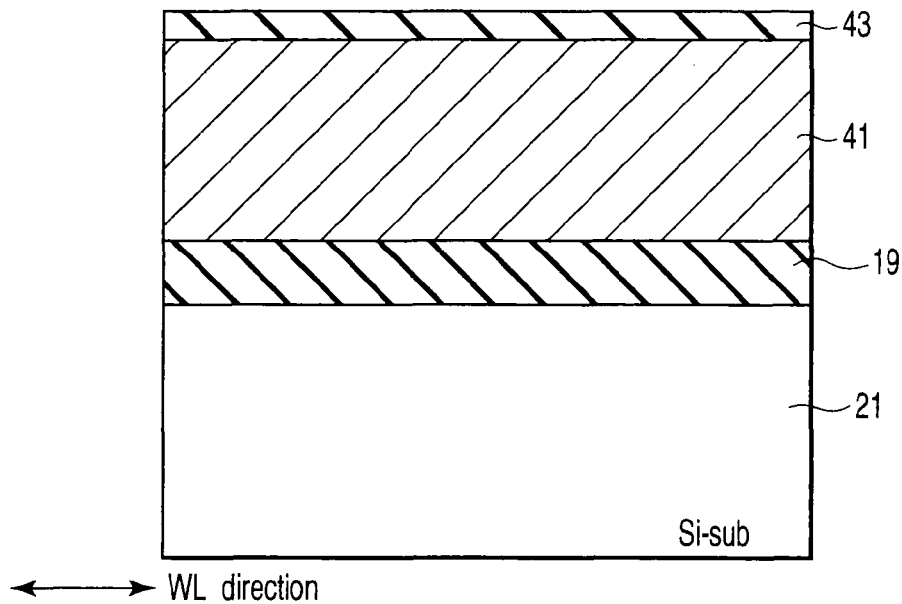
FIG. 12 is a cross-sectional view, taken in the word line direction, illustrating a fabrication step of a semiconductor memory device according to Modification 1 of the present invention.

To start with, as shown in FIG. 12, using the same fabrication steps as in the first embodiment, a tunnel insulation film 19, a floating electrode material 41 and a first mask material 43 are successively formed on the semiconductor substrate 21.

Figure 13:
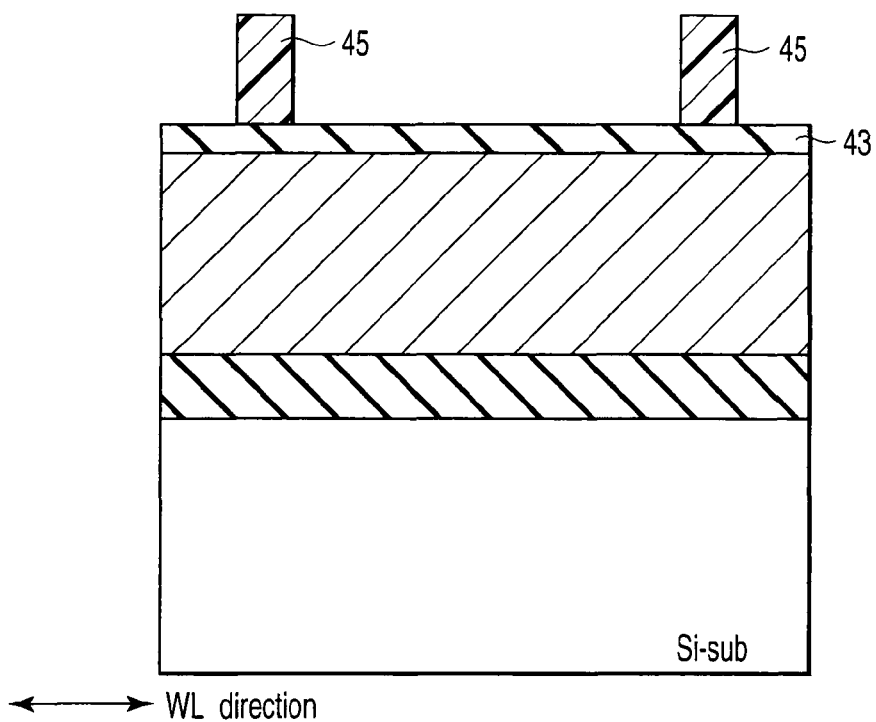
FIG. 13 is a cross-sectional view, taken in the word line direction, illustrating a fabrication step of the semiconductor memory device according to Modification 1 of the invention.

As shown in FIG. 13, a photoresist 45 is coated on the first mask material 43. The photoresist 45 is exposed and developed, and the photoresist 45 is patterned in such a manner that the surface of that part of the first mask material 43, which is other than the part that becomes a second floating electrode, is exposed.

Figure 14:
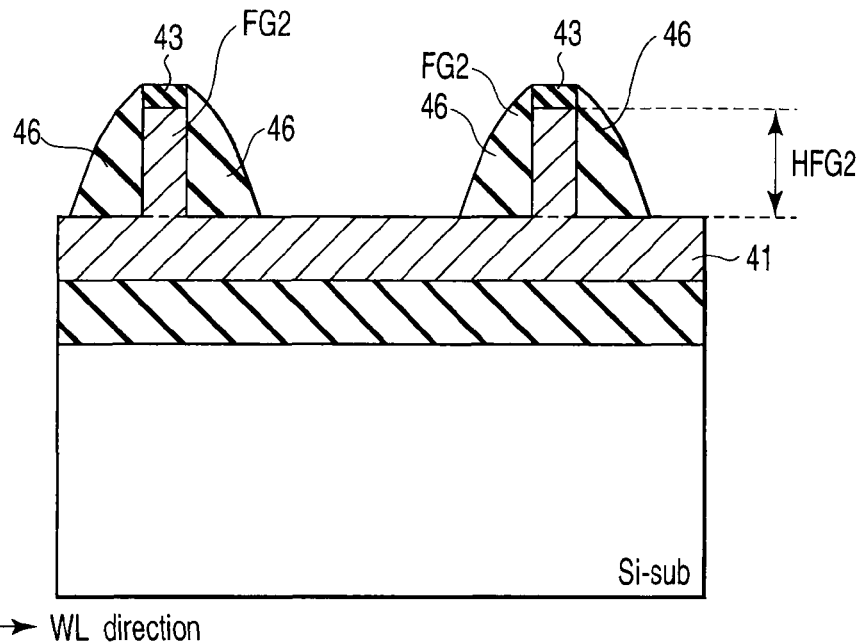
FIG. 14 is a cross-sectional view, taken in the word line direction, illustrating a fabrication step of the semiconductor memory device according to Modification 1 of the invention.
Figure 15:
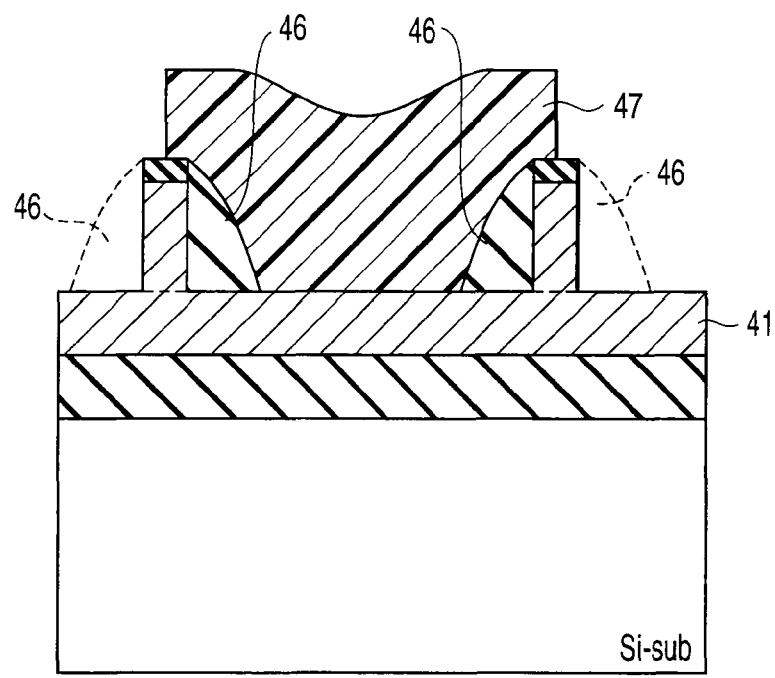
FIG. 15 is a cross-sectional view, taken in the word line direction, illustrating a fabrication step of the semiconductor memory device according to Modification 1 of the invention.

Subsequently, as shown in FIG. 14, using the patterned photoresist 45 and first mask material 43 as a mask, anisotropic etching, such as RIE, is performed down to a level corresponding approximately to the thickness of a first floating electrode. Thus, the floating electrode material 41 under the first mask material 43 is left, and the second floating electrode FG2 is formed. At the time of this step, it is preferable to control, e.g. the voltage for anisotropic etching so that the height HFG2 of the second floating electrode FG2 may become double or more the thickness of an inter-gate insulation film IPD which is to be formed later.

Then, a second mask material 46 is formed on the above-described formed structure. For example, using anisotropic etching such as RIE, the second mask material 46 is left on side walls of the second floating electrode FG2.

Further, a photoresist 47 is coated on the above-described formed structure. The photoresist 47 is exposed and developed, and is patterned so as to expose the surface of the floating electrode material 41 which becomes a second device isolation insulation film. Then, using the patterned photoresist 47 as a mask, anisotropic etching, such as RIE, is performed to selectively remove the exposed second mask material 46.

As shown in FIG. 16, the photoresist 47 is then peeled by an asher or the like.

As shown in FIG. 17, using the remaining first and second mask materials 43 and 46 as a mask, anisotropic etching, such as RIE, is performed down to a predetermined level in the semiconductor substrate 21, and a trench 48 is formed. By this fabrication step, the tunnel insulation film 19 and first floating electrode FG1 are formed.

Although not shown, a silicon oxide film, for instance, is buried in the trench 48, and first and second device isolation insulation films STI1 and STI2 are formed.

Subsequently, using well-known fabrication steps, a control gate, an interlayer insulation film, a bit line contact, a source line contact, a bit line and a source line are formed, and the semiconductor memory device according to Modification 1 is fabricated.

According to the above-described fabrication method of the semiconductor memory device of Modification 1, at least the same advantageous effects (1) and (2) as described above are obtained. The fabrication method of Modification 1 is applicable where necessary.

Second Embodiment

An Example Including a Low Dielectric Constant Film

<Example of Structure>

Next, a semiconductor memory device according to a second embodiment of the invention is described with reference to FIG. 18. The second embodiment relates to an example including a low dielectric constant film 55. A detailed description of the parts common to those in the first embodiment is omitted.

Figure 18:
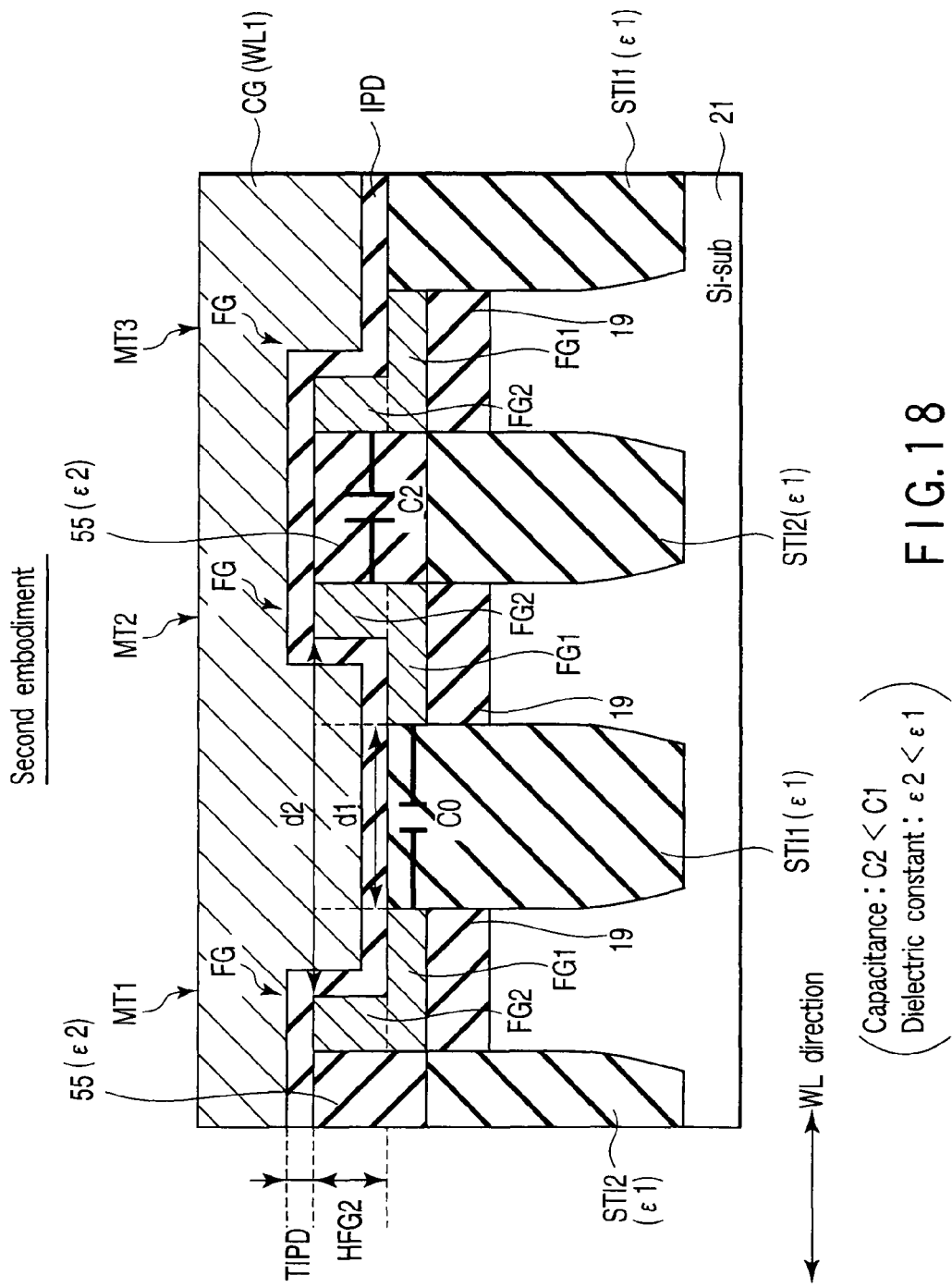
FIG. 18 is a cross-sectional view, taken in the word line direction, showing a semiconductor memory device according to a second embodiment of the present invention.

As shown in FIG. 18, the second embodiment differs from the first embodiment in that a memory cell transistor MT1, MT2, MT3 according to the second embodiment further includes a low dielectric constant film 55, which is provided on the second device isolation insulation film STI2 and has a lower dielectric constant $\in 2$ than a dielectric constant $\in 1$ of the second device isolation insulation film STI2 (dielectric constant: $\in 2 < \in 1$). The low dielectric constant film 55 is formed of, e.g. a fluorine-added silicon oxide film or a porous silicon oxide film.

Accordingly, the capacitance value of the parasitic capacitance C2, which occurs in the low dielectric constant film 55 relating to the present embodiment, is lower than the capacitance value of the parasitic capacitance which occurs in the second device isolation insulation film STI2 relating to the first embodiment (capacitance: C2<C1). The reason for this is that the capacitance value of the parasitic capacitance is proportional to the dielectric constant of the substance that is interposed between the floating electrodes FG, as indicated by the above equation ($\times$).

Thus, the coupling noise between the memory cell transistors MT2 and MT3, which neighbor each other with the second device isolation insulation film STI2 being interposed, can advantageously be reduced.

<Example of Fabrication Method>

Next, a fabrication method of the semiconductor memory device according to the present embodiment is described with reference to FIG. 19 and FIG. 20. In the description below, the memory cell transistors MT1 and MT2, which have been described with reference to FIG. 18, are exemplified.

To start with, as shown in FIG. 19, using the same fabrication steps as in the first embodiment, a buried insulation film 33, a tunnel insulation film 19, a first floating electrode FG1 and a mask material 32 are formed on the semiconductor substrate 21.

Then, a photoresist 56 is coated on the above-described formed structure, and the photoresist 56 is patterned so that the surface of the buried insulation film, which becomes the second device isolation insulation film, is exposed.

Using the patterned photoresist 56 as a mask, wet etching with use of, e.g. ammonium fluoride is performed, and the exposed buried insulation film is selectively etched down to the vicinity of the surface of the first floating electrode FG1, and the second device isolation insulation film STI2 is formed and an opening 57 is formed.

Subsequently, as shown in FIG. 20, a low dielectric constant layer, such as a fluorine-added silicon oxide film or a porous silicon oxide film, which has a lower dielectric constant than the buried insulation film 33, is deposited by, e.g. CVD in the opening 57. Then, the photoresist 56 is removed. Subsequently, using CMP, for instance, the low dielectric constant layer is planarized at the level of the surface of the mask material 32, and the low dielectric constant film 55 is formed.

Following the above, using well-known fabrication steps, a control gate, an interlayer insulation film, a bit line contact, a source line contact, a bit line and a source line are formed, and the semiconductor memory device according to the present embodiment is fabricated.

Advantageous Effects of the Second Embodiment

According to the above-described semiconductor memory device of the present embodiment and the fabrication method of the semiconductor memory device, at least the same advantageous effects (1) and (2) as described above are obtained. Furthermore, at least the following advantageous effect (3) can be obtained.

(3) The parasitic capacitance C2, which occurs in the low dielectric constant film 55, can be reduced, and the coupling noise of the floating electrodes FG, which sandwich the low dielectric constant film 55, can be decreased.

As shown in the drawings, the memory cell transistor MT1, MT2, MT3 according to the second embodiment further includes the low dielectric constant film 55, which has the lower dielectric constant $\in 2$ than the dielectric constant $\in 1$ of the second device isolation insulation film STI2 and is provided on the second device isolation insulation film STI2 (dielectric constant: $\in 2 < \in 1$).

Accordingly, the capacitance value of the parasitic capacitance C2, which occurs in the low dielectric constant film 55 relating to the present embodiment, is lower than the capacitance value of the parasitic capacitance which occurs in the second device isolation insulation film STI2 relating to the first embodiment (capacitance: C2<C1). The reason for this is that the capacitance value of the parasitic capacitance is proportional to the dielectric constant of the substance that is interposed between the floating electrodes FG, as indicated by the above equation (X).

Therefore, the parasitic capacitance C2 occurring in the low dielectric constant film 55 can be reduced, and the coupling noise of the floating electrodes FG, which sandwich the low dielectric constant film 55, can advantageously be reduced.

Modification of Second Embodiment

<Example of Configuration>

A semiconductor memory device according to a modification of the second embodiment of the invention is described with reference to FIG. 21. According to this modification, an air gap 77 is provided in the central part of the low dielectric film 55 of the second embodiment. In the description below, a detailed description of the parts common to those in the second embodiment is omitted.

As shown in FIG. 21, memory cell transistors MT1, MT2 and MT3 according to the modification are featured in that an air gap 77 is provided in the central part of the low dielectric film 55 of a second device isolation insulation film STI2. The air gap is vacuum or filled with an inert gas such as nitrogen gas or with air. This means that the air gap 77 has a lower dielectric constant $\in 3$ than the dielectric constant of the low dielectric constant film 55.

Advantageous Effect of Modification

In addition to the advantageous effects of the second embodiment, the modification provides the advantageous effect that the parasitic capacitance of the low dielectric film 55 and air gap 77 can be reduced, and the coupling noise of the floating electrodes FG sandwiching the low dielectric film 55 can decreased, accordingly.

The air gap 77 need not be necessarily in the central part of the low dielectric film 55. It may be formed at any position in the low dielectric film 55 as long as it is sandwiched by the floating electrodes FG.

Furthermore, the low dielectric film 55 may be entirely replaced with the air gap 77. In this case, the coupling noise of the floating electrodes FG sandwiching the air gap 77 can be reduced.

Third Embodiment

An Example Including a Third Floating Electrode

<Example of Structure>

Next, a semiconductor memory device according to a third embodiment of the invention is described with reference to FIG. 22. The third embodiment relates to an example further including a third floating electrode FG3. A detailed description of the parts common to those in the first embodiment is omitted.

Figure 22:
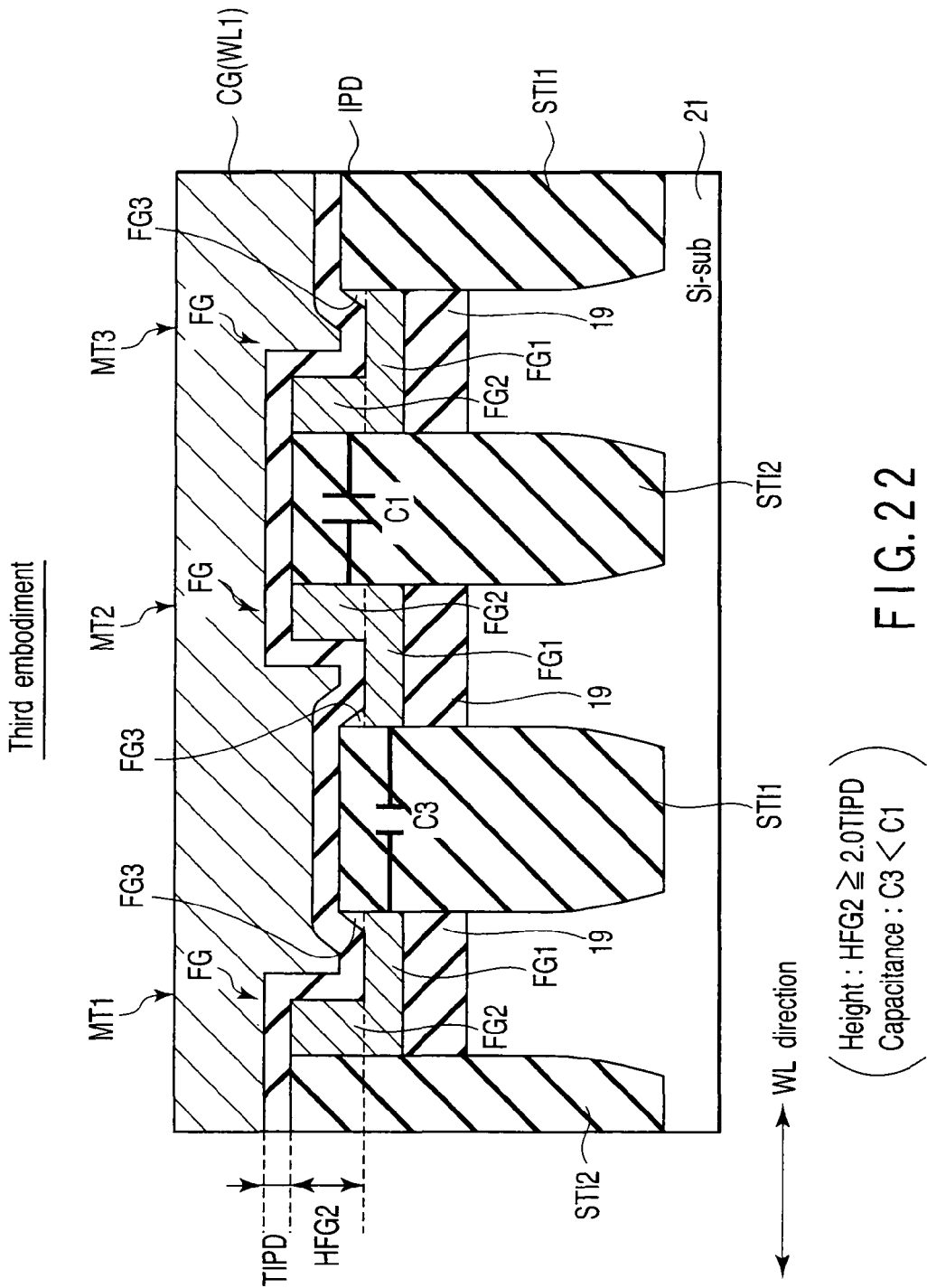
FIG. 22 is a cross-sectional view, taken in the word line direction, showing a semiconductor memory device according to a third embodiment of the present invention.

As shown in FIG. 22, the third embodiment differs from the first embodiment in that a memory cell transistor MT1, MT2, MT3 according to the third embodiment further includes a third floating electrode FG3 which is provided on the other end portion of the first floating electrode FG1 and has a less height than the second floating electrode FG2.

Therefore, the volume of the floating electrode FG of this embodiment can be made greater than the volume of the floating electrode of the first embodiment, and a greater amount of charge can be injected and retained.

<Fabrication Method>

Next, a fabrication method of the semiconductor memory device according to the present embodiment is described with reference to FIG. 23, FIG. 24 and FIG. 25. In the description below, the memory cell transistors MT1 and MT2, which have been described with reference to FIG. 22, are exemplified.

Figure 23:
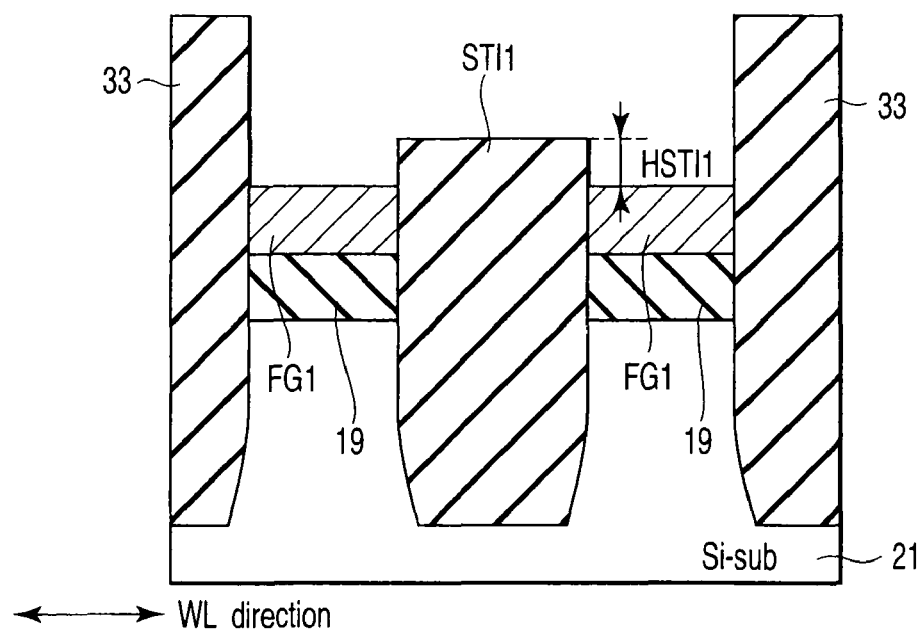
FIG. 23 is a cross-sectional view, taken in the word line direction, illustrating a fabrication step of the semiconductor memory device according to the third embodiment.

To start with, as shown in FIG. 23, using the same fabrication steps as in the first embodiment, a buried insulation film 33, a first device isolation insulation film STI1, a tunnel insulation film 19 and a first floating electrode FG1 are formed on the semiconductor substrate 21. When the first device isolation insulation film STI1 is formed, the application voltage at the time of etching, for instance, is controlled. Thereby, the height HSTI1 of the first device isolation insulation film STI1, which projects from the surface of the first floating electrode FG1, is made greater than the height of the first device isolation insulation film relating to the first embodiment shown in FIG. 8.

Figure 24:
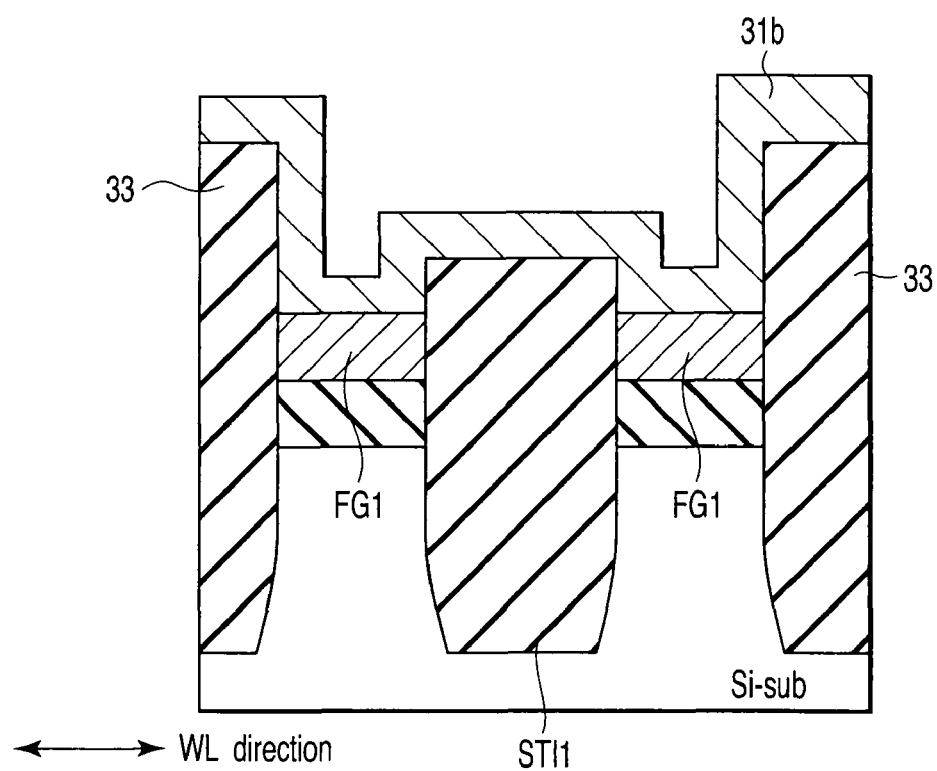
FIG. 24 is a cross-sectional view, taken in the word line direction, illustrating a fabrication step of the semiconductor memory device according to the third embodiment.

Then, as shown in FIG. 24, a polysilicon layer, for instance, is deposited by, e.g. CVD on the buried insulation film 33, the first floating electrode FG1 and the first device isolation insulation film STI1, and a second floating electrode 31b is formed.

Figure 25:
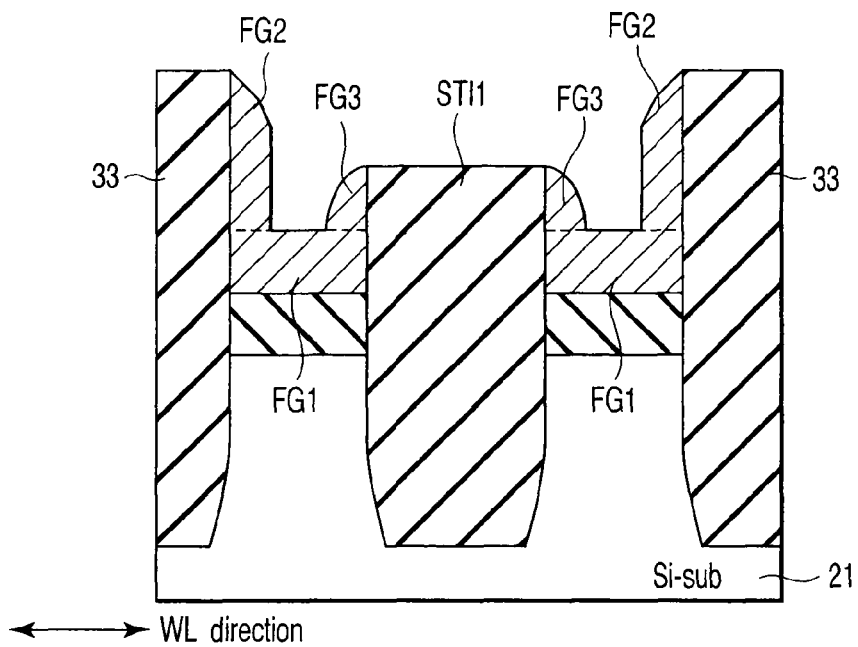
FIG. 25 is a cross-sectional view, taken in the word line direction, illustrating a fabrication step of the semiconductor memory device according to the third embodiment.

Subsequently, as shown in FIG. 25, the second floating electrode material 31b is etched back by anisotropic etching such as RIE, and the second floating electrode material 31b is left on both side walls of the first device isolation insulation film STI1. Thus, the third floating electrode FG3 is formed in a self-alignment manner.

Advantageous Effects of the Third Embodiment

According to the above-described semiconductor memory device of the present embodiment and the fabrication method of the semiconductor memory device, at least the same advantageous effects (1) and (2) as described above are obtained.

Moreover, the memory cell transistor MT1, MT2, MT3 according to the third embodiment further includes the third floating electrode FG3 which is provided on the other end portion of the first floating electrode FG1 and has a less height than the second floating electrode FG2.

Therefore, the volume of the floating electrode FG of this embodiment can be made greater than the volume of the floating electrode of the first embodiment, and a greater amount of charge can advantageously be injected and retained.

In the present embodiment, too, as described in connection with the second embodiment, a low dielectric constant film, which has a lower dielectric constant than a dielectric constant of the second device isolation insulation film STI2, may be provided on the second device isolation insulation film STI2. In this case, the above-described advantageous effect (3) can additionally be obtained.

Other Embodiments

The present invention is not limited to the above-described first to third embodiments and Modification 1, and various modifications may be made in practice without departing from the spirit of the invention. For instance, Example 1 and Example 2, which will be described below, are thinkable as other embodiments.

Example 1

Example 1 is an embodiment in which the first floating electrode FG1 and the second floating electrode FG2 are formed of different electrically conductive materials.

In this case, for example, in the etching step described with reference to FIG. 10, a selectivity ratio can be obtained between the first and second floating electrode materials 31a and 31b.

Thus, in the step of forming the first and second floating electrodes FG1 and FG2, the reliability can advantageously be improved.

Example 2

Example 2 is an embodiment in which a protection film is provided on the first floating electrode FG1.

In this case, too, for example, in the etching step described with reference to FIG. 10, a selectivity ratio can be obtained between the first and second floating electrode materials 31a and 31b.

Therefore, in the step of forming the first and second floating electrodes FG1 and FG2, the reliability can advantageously be improved.

[Modes of the Fabrication Method of the Semiconductor Memory Device]

The above-described first to third embodiments and the modification have at least the following modes of methods of fabrication of semiconductor memory devices.

<First Mode>

A method of fabrication of a semiconductor memory device according to a first mode, wherein first and second memory cell transistors neighbor with a first device isolation insulation film being interposed, comprising:

successively forming a tunnel insulation film, a first floating electrode material and a cap material on a semiconductor substrate;

selectively removing the cap material on a device isolation region;

performing anisotropic etching by using the remaining cap material as a mask, and forming a trench in the semiconductor substrate, which penetrates the first floating electrode and the tunnel insulation film;

forming a buried insulation film in the trench;

selectively etching the buried insulation film which becomes the first device isolation insulation film, and forming the first device isolation insulation film;

removing the cap material;

forming a second floating electrode material on the buried insulation film, the first floating electrode material and the first device isolation insulation film;

etching back the second floating electrode material and leaving the second floating electrode material on side walls of the buried insulation film in a self-alignment manner;

planarizing a surface of the left second floating electrode material and a surface of the buried insulation film, and forming a second floating electrode and a second device isolation insulation film;

forming an inter-gate insulation film on the first and second device isolation insulation films and the first and second floating electrodes; and forming a control electrode on the inter-gate insulation film.

According to the fabrication method of the semiconductor memory device relating to the first mode, when the second floating electrode is formed, the second floating electrode material is left on the side walls of the buried insulation film, and the second floating electrode can be formed in a self-alignment manner. Therefore, the manufacturing cost can advantageously be reduced in that there is no need to perform a special fabrication step, such as patterning, for forming the second floating electrodes.

<Second Mode>

A method of fabrication of a semiconductor memory device according to a second mode, wherein first and second memory cell transistors neighbor with a first device isolation insulation film being interposed, comprising:

successively forming a tunnel insulation film, a first floating electrode material and a first mask material on a semiconductor substrate;

forming in the first mask material an opening which exposes a surface of the floating electrode material other than a part that becomes a second floating electrode;

performing anisotropic etching by using the first mask material as a mask, leaving the floating electrode material under the first mask material, and forming the second floating electrode;

forming a second mask material on the formed structure;

etching back the second mask material, and leaving the second mask material on side walls of the second floating electrode;

selectively removing the second mask material on the floating electrode material which becomes a second device isolation insulation film;

forming a trench which reaches a predetermined depth in the semiconductor substrate, by using the left first and second mask materials as a mask;

burying an insulation film in the trench and forming the first and second device isolation insulation films;

removing the first and second mask materials;

forming an inter-gate insulation film on the first and second floating electrodes and the first and second device isolation insulation films; and forming a control electrode on the inter-gate insulation film.

The fabrication method of the semiconductor memory device according to the above-described second mode is applicable where necessary.

Comparative Example

Figure 26:
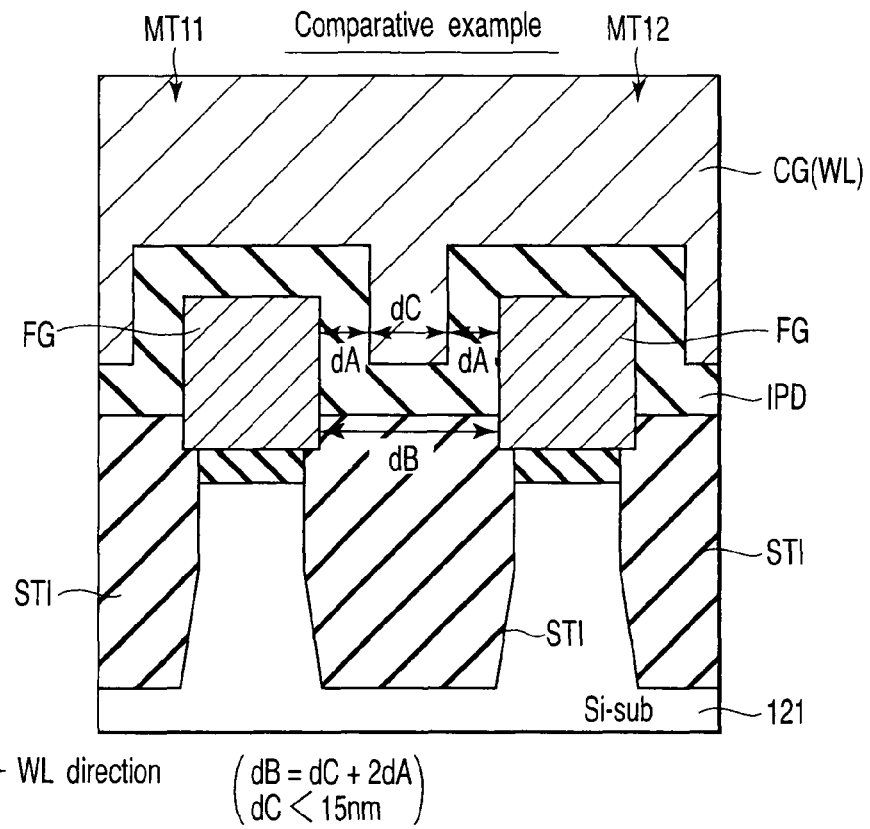
FIG. 26 is a cross-sectional view, taken in the word line direction, showing a semiconductor memory device according to a comparative example.
Figure 27:
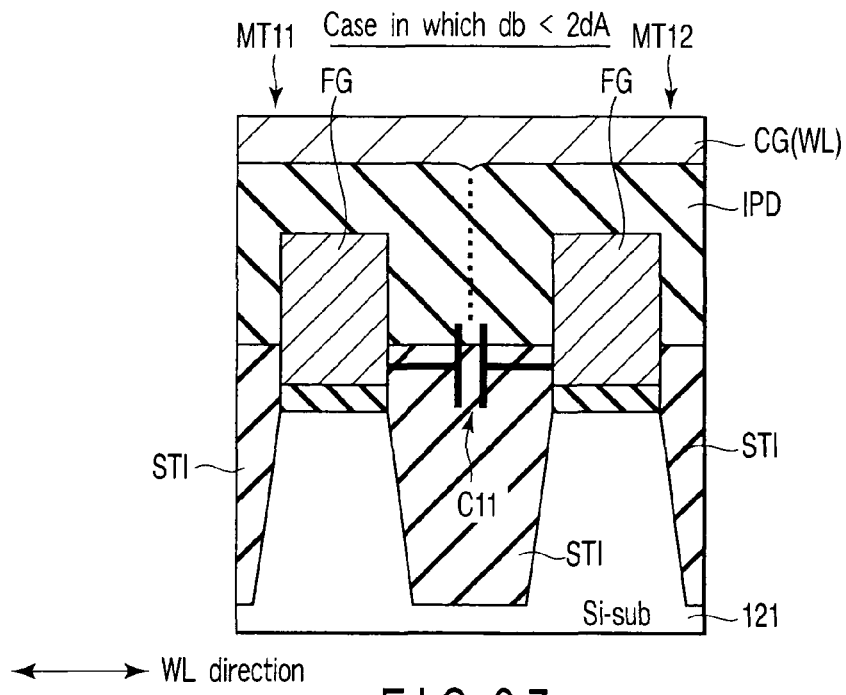
FIG. 27 is a cross-sectional view, taken in the word line direction, showing a semiconductor memory device according to a comparative example.

Next, for comparison with the semiconductor memory devices according to the above-described embodiments and modification, a description is given of a semiconductor memory device relating to a comparative example with reference to FIG. 25 to FIG. 27. A detailed description of the parts common to those in the first embodiment is omitted.

FIG. 26 is a cross-sectional view showing memory cell transistors MT11 and MT12 of a 63 nm-generation NAND flash memory in a word line direction.

As shown in FIG. 27, the width dB between floating electrodes FG neighboring in the word line direction is the sum of double the thickness of an inter-gate insulation film IPD and a width dC of the control gate CG (word line WL) which is put in the remaining space (dB=dC+2dA).

For example, in the case of the 63 nm-generation NAND flash memory relating to the comparative example, the width dC of the control gate CG that is put in the remaining space is about 15 nm or less (dC<15 nm). In other words, even in the 63 nm-generation NAND flash memory, the space width, which is left after the formation of the inter-gate insulation film IPD, is only less than 15 nm. The control gate GC is formed in the space width dC, thereby reducing the coupling noise between the neighboring floating electrodes FG.

However, as shown in FIG. 27, if the 63 nm generation, for example, transitions to the next generation of finer structures, the width between floating electrodes FG neighboring in the word line direction will become smaller.

Consequently, the width dB between the floating electrodes FG neighboring in the word line direction becomes less than double the physical film thickness of the inter-gate insulation film IPD (dB<2dA). In this case, the value of the remaining space width dC is no longer a positive (+) value, and the space of the width dB between the floating electrodes FG is entirely filled with the inter-gate insulation film IPD alone.

In this case, it is not sufficient that the remaining space width dC is greater than 0. If consideration is given to depletion of polysilicon (Si) of which the floating electrode FG is formed, the thickness of at least about 5 nm is better.

For example, a NAND flash memory of the generation of 30 nm or less is assumed, the physical film thickness dA of the inter-gate insulation film IPD is about 13 nm, and the remaining space dC is about 15 nm. Thus, approximately, 2dA+dC=31 nm, and the space between the neighboring FG is entirely filled with the inter-gate insulation film IPD. Consequently, the structure in which the control gate CG is put in the above-described space width dC cannot be realized, and a conductor for shielding is not present between the neighboring floating gates FG.

Since the parasitic capacitance C11 between the floating gates FG in FIG. 27 increases, the coupling noise between the floating electrodes FG increases. The coupling noise is proportional to the magnitude of the parasitic capacitance C11 between the floating electrodes FG. For example, if the voltage of the floating electrode FG of one memory cell MT11 has varied, the voltage variation in the floating electrode FG of the other memory cell MT12 also increases due to coupling since the parasitic capacitance C11 is large. As a result, the coupling noise increases.

Figure 28:
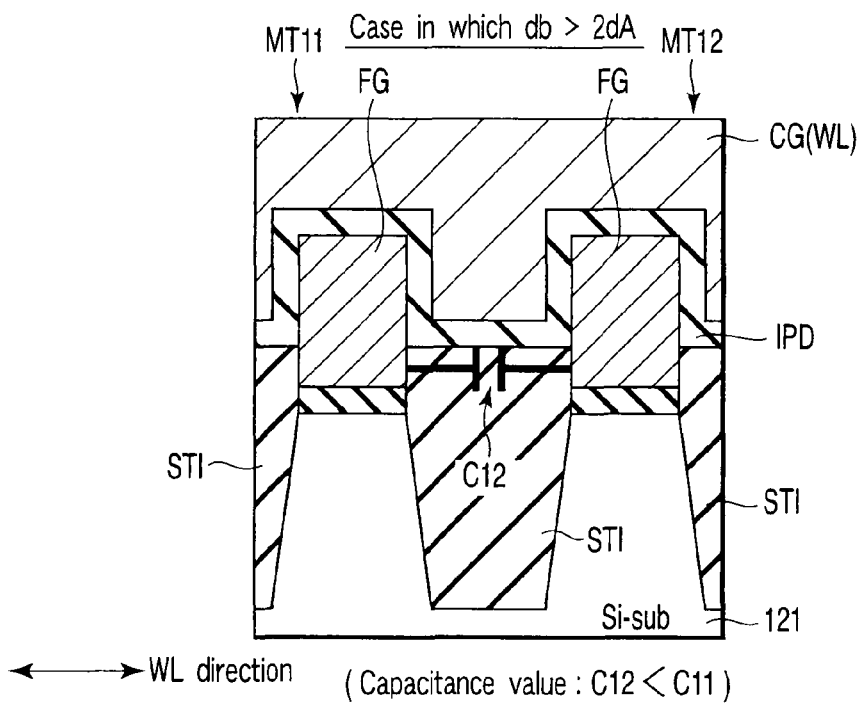
FIG. 28 is a cross-sectional view, taken in the word line direction, showing a semiconductor memory device according to a comparative example.

On the other hand, in a NAND flash memory shown in FIG. 28, a control gate CG is formed between neighboring floating gates FG. A fixed voltage of, e.g. 0V is applied to the control electrode CG. Thus, the parasitic capacitance C12 between the floating electrodes FG is reduced (capacitance value: C12<C11), and the coupling noise between the floating electrodes FG is shielded and reduced.

However, in this structure since space between the neighboring floating electrodes FG cannot be decreased, the degree of microfabrication is limited.

As has been described above, in the semiconductor memory device according to the comparative example, if microfabrication is to be carried out, the coupling noise between the neighboring floating electrodes FG would increase.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of fabrication of a semiconductor memory device, comprising:

forming a tunnel insulation film on a semiconductor substrate;

forming a first floating electrode material on the tunnel insulation film;

forming trenches in that part of the semiconductor substrate which serves as device isolation regions, the trenches being formed through the first floating electrode material and the tunnel insulation film;

forming first and second device isolation insulation films in the trenches such that the first and second device isolation insulation films have an upper surface higher than that of the first floating electrode material;

forming a second floating electrode material on the first floating electrode material, and the first and second device isolation insulation films;

etching back the second floating electrode material and leaving the second floating electrode material on side walls of the second device isolation insulation film, thereby forming a floating electrode having an L-shaped cross section;

forming an inter-gate insulation film on the first and second device isolation insulation films and the first and second floating electrodes; and forming a control electrode on the inter-gate insulation film, wherein when the floating electrode having an L-shaped cross section is formed, a distance between the second floating electrodes which neighbor in a word line direction is set to be greater than a distance between the first floating electrodes which neighbor in the word line direction.

2. The method according to claim 1, wherein when the second floating gate material is etched back and the second floating electrode is left on the side walls of the second device isolation insulation film, a height of the second floating electrode material is set to be double or more a film thickness of the inter-gate insulation film.

3. The method according to claim 1, wherein when the first and second device isolation insulation films are formed, further comprising etching back an upper surface of the first device isolation insulation film until reaching an upper surface of the first floating electrode material, and forming the second device isolation insulation film to have an upper surface higher than that of the first floating electrode material and the first device isolation insulation film to have an upper surface same as that of the first floating electrode material.

4. The method according to claim 1, wherein when the first and second device isolation insulation films are formed, further comprising etching back an upper surface of the first device isolation insulation film to have a higher location than an upper surface of the first floating electrode material, and forming the first device isolation insulation film to have an upper surface higher than that of the first floating electrode material and the second isolation insulation film to have an upper surface higher than that of the first floating electrode material and the first device isolation insulation film.

5. The method according to claim 4, wherein when the second floating electrode material is etched back, the second floating electrode material is left on side walls of the second device isolation insulation film, and a third floating electrode is left on side walls of the first device isolation insulation film in self alignment simultaneously with the second floating electrode.

6. The method according to claim 1, further comprising forming an opening in the first and second device isolation insulation films after formation of the first and second device isolation insulation films; and forming low dielectric layers having a lower dielectric constant than that of the first and second device isolation insulation films.

7. The method according to claim 6, further comprising forming air gaps when the low dielectric layers are formed.

* * * * *